United States Patent
Akiyama

(10) Patent No.: US 6,603,176 B2
(45) Date of Patent: Aug. 5, 2003

(54) POWER SEMICONDUCTOR DEVICE FOR POWER INTEGRATED CIRCUIT DEVICE

(75) Inventor: Hajime Akiyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 8 days.

(21) Appl. No.: 09/835,445

(22) Filed: Apr. 17, 2001

(65) Prior Publication Data

US 2002/0043699 A1 Apr. 18, 2002

(30) Foreign Application Priority Data

Oct. 18, 2000 (JP) .......................... 2000-317991

(51) Int. Cl.[7] .................... H01L 27/12; H01L 27/092
(52) U.S. Cl. ............................... 257/351; 257/372
(58) Field of Search ................ 257/347, 350, 257/351, 372

(56) References Cited

U.S. PATENT DOCUMENTS

| | | | | |
|---|---|---|---|---|
| 5,874,768 A | * | 2/1999 | Yamaguchi et al. | 257/350 |
| 6,037,634 A | * | 3/2000 | Akiyama | 257/347 |
| 6,130,458 A | * | 10/2000 | Takagi et al. | 257/351 |
| 6,133,610 A | * | 10/2000 | Bolam et al. | 257/351 |
| 6,150,697 A | * | 11/2000 | Teshigahara et al. | 257/347 |
| 6,307,232 B1 | * | 10/2001 | Akiyama et al. | 257/347 |
| 6,313,508 B1 | * | 11/2001 | Kobayashi | 257/351 |

OTHER PUBLICATIONS

Kiyoto Watabe, et al., "A Novel P–Channel Dual Action for HVIC," IEEE BCTM 9.2, 1997, pp. 147–150.

Kiyoto Watabe, et al., "A New Phenomenon of P–Channel Dual Action Device, "Proceedings of 1998 International Symposium on Power Semiconductor Devices & Ics, pp. 363–366.

Kiyoto Watabe, et al., "AN 0.8–$\mu$m High–Voltage IC Using A Newly Designed 600–V Lateral P–Channel Dual–Action Device On SOI," IEEE Journal of Solid State Circuits, vol. 9, Sep. 1998, pp. 1423–1427.

* cited by examiner

Primary Examiner—Gene M. Munson
(74) Attorney, Agent, or Firm—Oblon, Spivak, McClelland, Maier & Neustadt, P.C.

(57) ABSTRACT

Provided is a DAD that improves resistance to latch-up and stabilizes breakdown voltage characteristic. Specifically, a first gate electrode (10) and a second drain electrode (13) are linear electrodes having a length not exceeding the length of a source electrode (9). An isolation region (20) is disposed on both end portions of these electrodes. The region surrounded by two isolation regions (20) and the source electrode (9) becomes a P channel MOS region (PR) where a P channel MOS transistor is to be formed. The isolation region (20) has a multi-trench structure that a plurality of trenches (21) are provided in a P type impurity region disposed so as to be rectangle as viewed in plan configuration. Each trench (21) is filled with a conductor such as polysilicon, and the filled conductor is disposed so that it makes no electrical contact with any specific part.

12 Claims, 26 Drawing Sheets

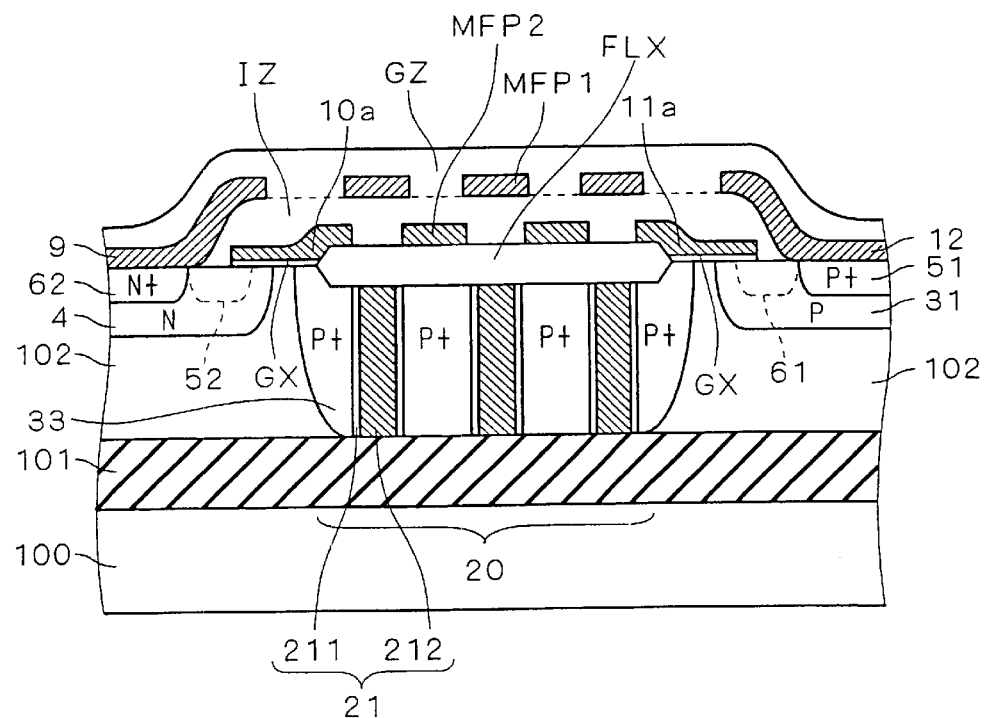
F I G . 3

F I G . 6
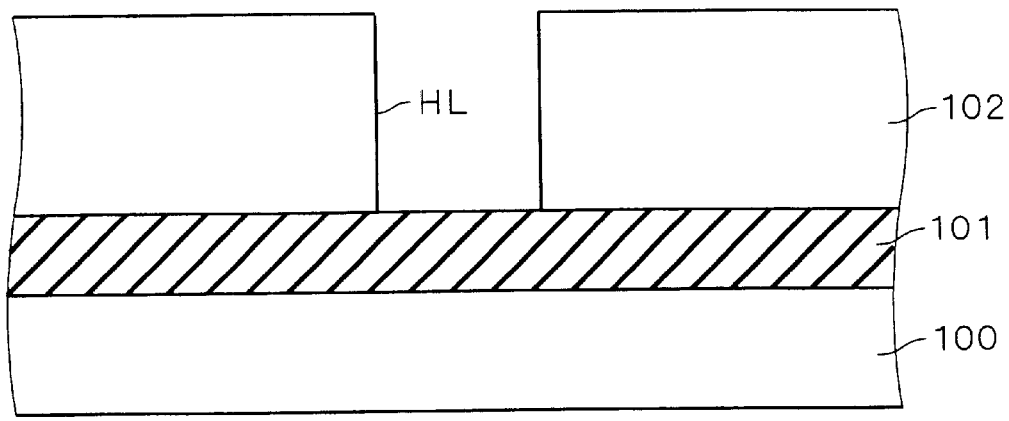
F I G . 7
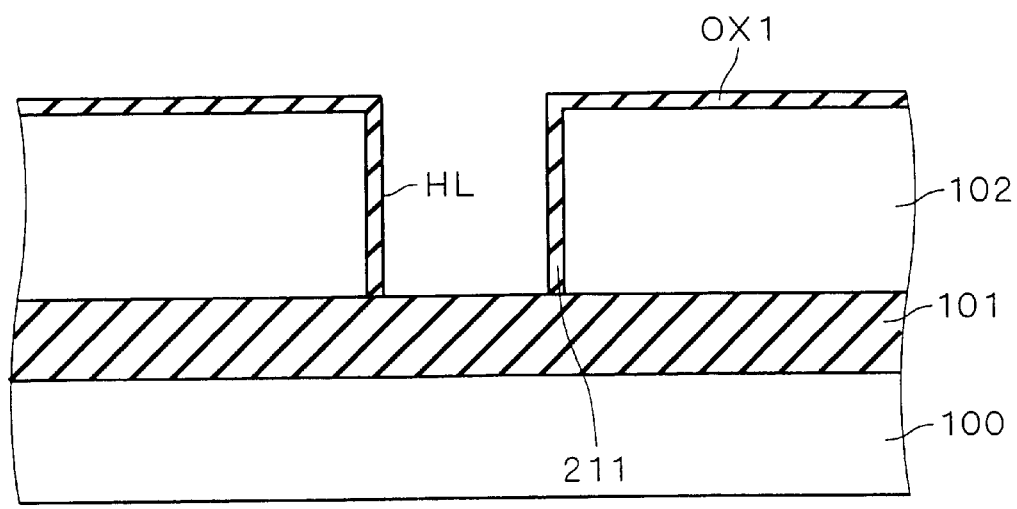

F I G . 15
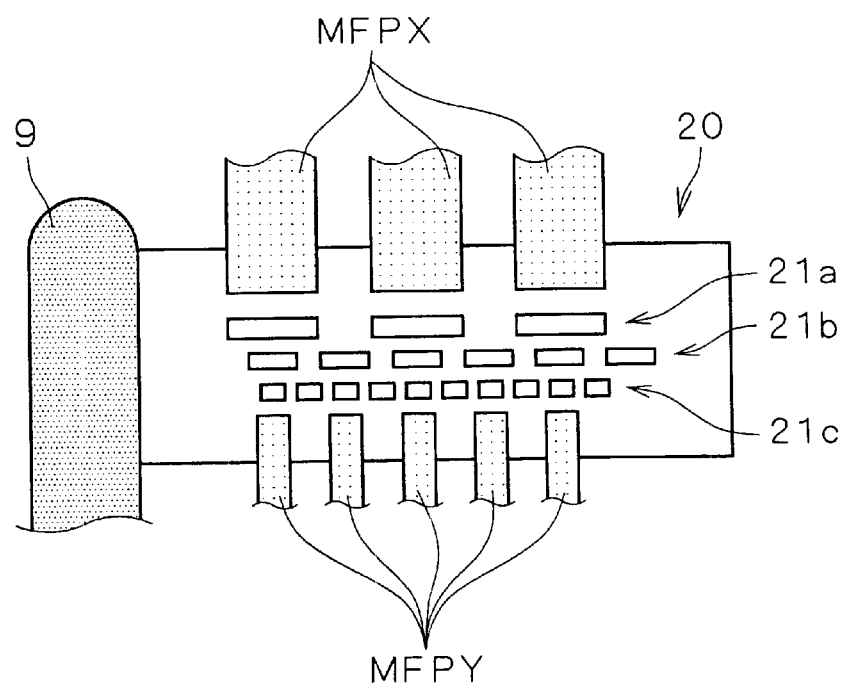

F I G . 2 2
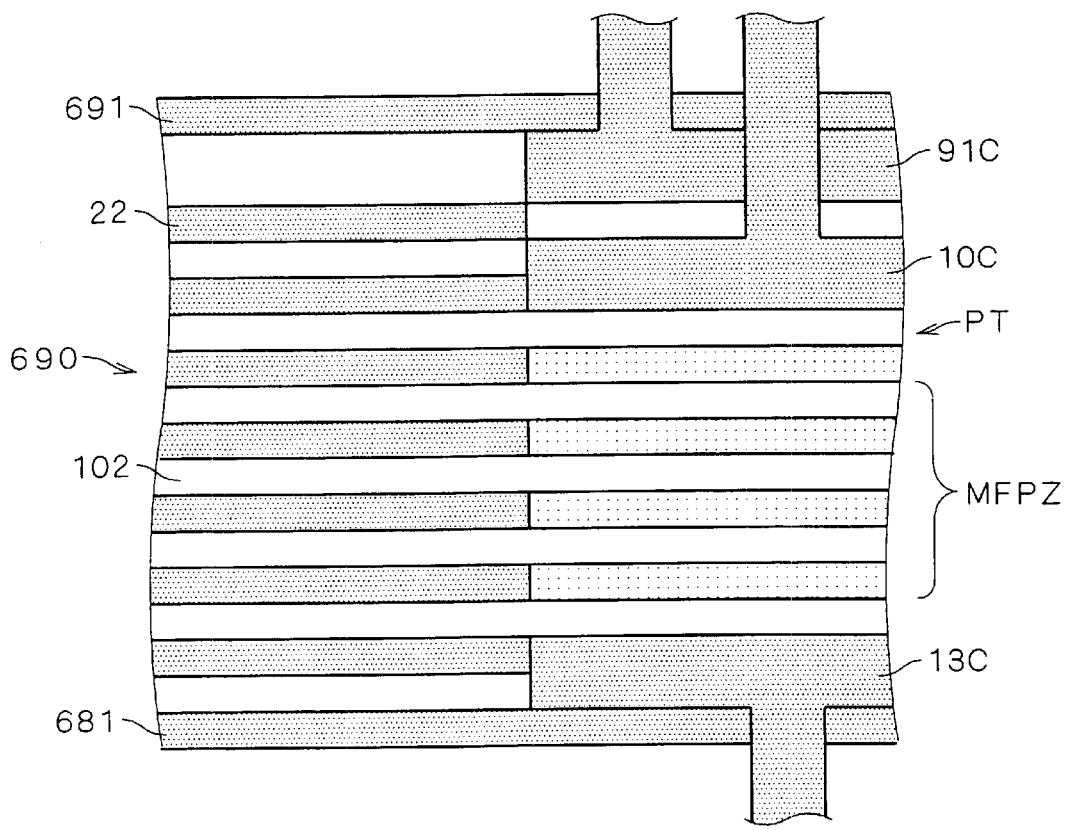

F I G . 2 4
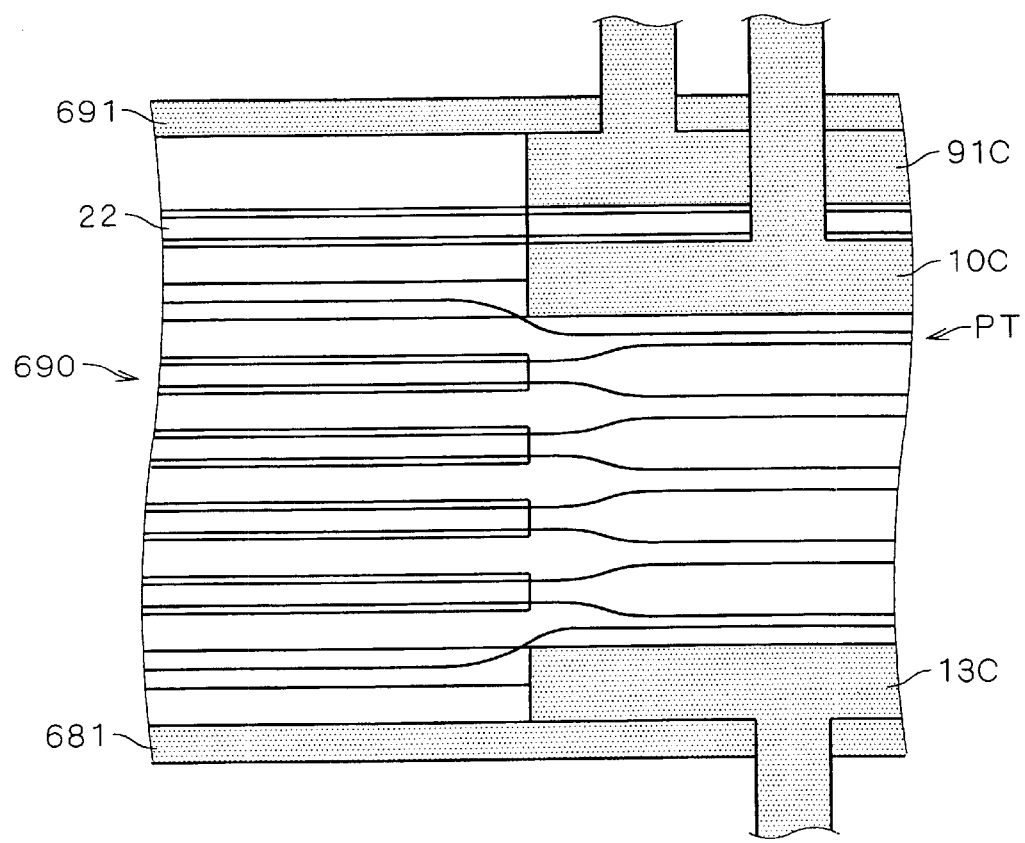

F I G . 2 5
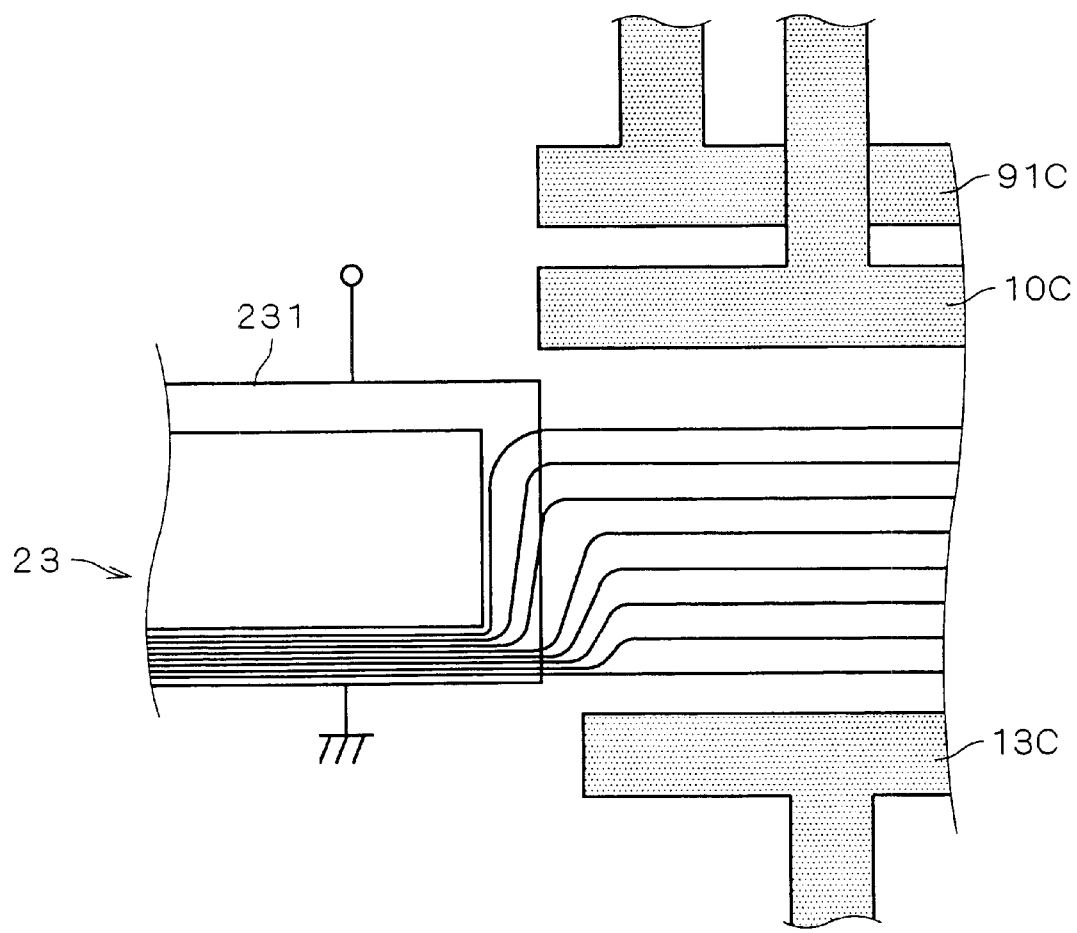

F I G . 29
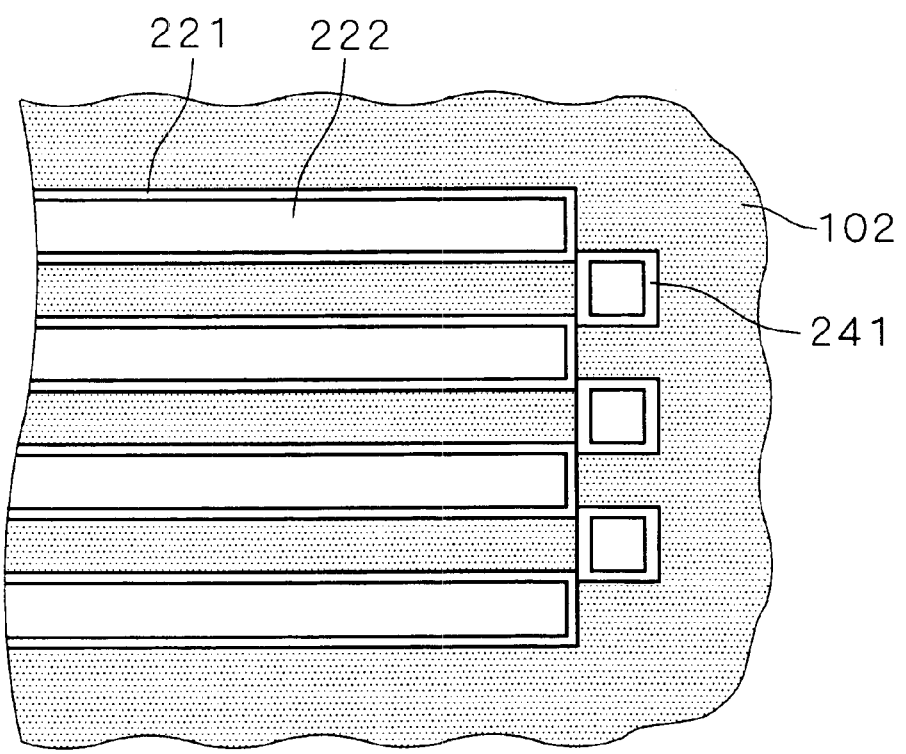

< BACKGROUND ART >

< BACKGROUND ART >

PARASITIC THYRISTOR COMPONENT

POWER SEMICONDUCTOR DEVICE FOR POWER INTEGRATED CIRCUIT DEVICE

BACKGROUND OF THE INVENTION

1. Field of the Invention

The present invention relates to a semiconductor device and, in particular, to a power semiconductor device contained in a power integrated circuit device.

2. Description of the Background Art

A power integrated circuit device (a power IC or HVIC: high voltage IC), in which power semiconductor devices and logical circuits are integrated on one chip, is indispensable to achieve high performance and low cost in the field of mechatronics such as motor control.

Especially in performing bridge rectification of a power line, a P channel LHVMOS (lateral high voltage MOS) transistor and a P channel DAD (dual action device) are usually used for a high side level shift device that transfers a signal (high side signal) sent from a high side (high potential) circuit to a low side (low potential) circuit.

The P channel DAD has such a structure that a P channel LHVMOS transistor and an N channel LHVMOS transistor are integrally formed, and has the characteristic of being able to improve on state current density five times the P channel LHVMOS (Reference material: "An 0.8 µm High-Voltage IC Using a Newly Designed 600-V Lateral P-Channel Dual-Action Device on SOI", by K. Watabe et al., IEEE Journal of Solid-state circuits, vol. 33, No. 9, September 1998).

FIG. 30 illustrates a plan configuration of a conventional P channel DAD 900. FIG. 31 illustrates a sectional configuration taken along the line A—A in FIG. 30.

Referring to FIG. 30, the P channel DAD 900 has at its midportion a linear source electrode 109, the periphery of which is surrounded by a first gate electrode 110. Further, the periphery of the first gate electrode 110 is surrounded by a second drain electrode 113, second gate electrode 111 and first drain electrode 112 in the order named. Every electrode is of an elongated annulus ring.

A source wiring SL, first gate wiring G1, second drain wiring D2, second gate wiring G2 and first drain wiring D1 are connected to the source electrode 109, first gate electrode 110, second drain electrode 112, second gate electrode 111 and first drain electrode 112, respectively.

The second drain wiring D2 is electrically connected via a resistance R1 to the second gate wiring G2, and the second gate wiring G2 is electrically connected via a resistance R2 to the first drain wiring D1.

Referring now to FIG. 31, a sectional configuration of the P channel DAD 900 will be described. The P channel DAD 900 is formed on a SOI substrate in which a buried oxide film 101 and a SOI layer 102 having a relatively low concentration of an N type impurity (i.e., N⁻) are disposed on a support substrate 100 such as a silicon substrate.

Looking from the lefthand of FIG. 31, a P type well region 1031, a P type well region 1032 and an N type well region 104 are disposed in the surface of the SOI layer so that these regions are isolated from one another. Between the P type well region 1032 and N type well region 104, a P type drain region 107 having a relatively low concentration of a P type impurity (i.e., P⁻) is formed so as to be continuous with the P type well region 1032. The P type drain region 107 is formed at a shallower position than the P type well region 1032.

Looking from the lefthand of FIG. 31, a P type diffusion region 1051 having a relatively high concentration of a P type impurity (i.e., P⁺) and an N type diffusion region 1061 having a relatively high concentration of an N type impurity (i.e., N⁺) are disposed adjacent each other in the surface of the P well region 1031. Looking from the righthand of FIG. 31, an N type diffusion region 1062 (i.e., N⁺) and a P type diffusion region 1052 (i.e., P⁺) are disposed adjacent each other in the surface of the N type well region 104.

Disposed on a first main surface of the SOI layer 102 are first and second drain electrodes 112, 113 and a source electrode 109. The first drain electrode 112 is formed in contact with the upper surface of the P type diffusion region 1051 and N type diffusion region 1061 in order to cause a short-circuit therebetween. The second drain electrode 113 is formed in contact with the upper surface of the P type well region 1032. The source electrode 109 is formed in contact with the upper surface of the P type diffusion region 1052 and N type diffusion region 1062 in order to cause a short-circuit therebetween.

As an insulating gate electrode, a first gate electrode 110 is disposed so as to cover the area from the upper surface of the peripheral portion of the P type drain region 107, the upper surface of the SOI layer 102 (between the P type drain region 107 and N type well region 104), the upper surface of the N type well region 104, and to the upper surface of the peripheral portion of the P type diffusion region 1052. A second gate electrode 111 is disposed so as to cover the area from the upper surface of the peripheral portion of the N type diffusion region 1061, the upper surface of the P type well region 1031, the upper surface of the SOI layer 102 (between the P type well region 1031 and P type well region 1032), and to the upper surface of the peripheral portion of the P type diffusion region 1032. A gate insulating film GX is present between the SOI layer 102 and the first gate electrode 110 or the second gate electrode 111.

A back side electrode 114 is formed over the entire surface of a second main surface of the support substrate 100, and the back side electrode 114 is usually connected to a ground potential.

Description will now be given of operation.

Off state (a forward blocking state) is realized by that the first drain electrode 112 and back side electrode 114 are connected to a ground potential in order to cause a short-circuit therebetween, a power source voltage is applied to the source electrode 109 to obtain a positive potential, and the first gate electrode 110 is connected to the source electrode 109 in order to cause a short-circuit therebetween. Note that the second gate electrode G2 is free (i.e., no control signal is provided from the exterior) under off state and also on state operation to be described later.

On state is realized by controlling the potential of the first gate electrode 110 to the minus side with respect to the source electrode 109. That is, by making the potential of the first gate electrode 110 lower than that of the source electrode 109, a P type channel is formed in the surface of the N type well region 104 and SOI layer 102 which are located immediately below the first gate electrode 110, and holes are therefore injected from the P type diffusion region 1052 to the P type drain region 107. This is the same operation as in a usual lateral P channel MOS transistor.

The holes injected to the P type drain region 107 pass through the second drain electrode 113 to the first drain electrode 112 via the resistances R1 and R2. During this, when the potential difference occurred in the resistances R1 and R2 becomes a predetermined value, the second gate electrode 111 functions as a gate, and an N type channel is formed in the surface of the P type well region 1031 immediately underlying the second gate electrode 111.

As a result, electrons are injected from the N type diffusion region 1061 to the SOI layer 102, and the injected electrons then reach the source electrode 109 via the N type well region 104 and N type diffusion region 1062. This is the same operation as in a lateral N channel MOS transistor.

Thus, the P channel DAD is a device in which the lateral P channel MOS transistor and the lateral N channel MOS transistor are combined to form a monolithic structure, and has the advantage of reducing on state resistance because the first gate electrode 110 is controlled by a power source side signal (high side signal) and the N channel MOSFET operates in on state.

However, in this conventional P channel DAD 900 so constructed, it is inherent to contain a P/N/P/N structure made up of the P type diffusion region 1052, N type well region 104, SOI layer 102, P type well region 1031 and N type diffusion region 1061. When a parasitic thyristor formed by the P/N/P/N structure is brought into on state, the device results in a latch-up state and goes out of control.

FIG. 32 illustrates an equivalent circuit of the P channel DAD 900. In FIG. 32, the emitter of an NPN type transistor Q3 is connected to the source of a P channel MOS transistor Q1, the collector of the NPN type transistor Q3 is connected to the base of a PNP type transistor Q4, the collector of the PNP type transistor Q4 is connected to the base of the NPN type transistor Q3, the emitter of the PNP type transistor Q4 is connected to the drain of the N channel MOS transistor Q2, and a thyristor parasitizes between the source (S) and drain (D) of the P channel DAD 900.

When this construction is subjected to a high density injection of electrons and holes, it might cause a modulation and lead to a latch-up state.

SUMMARY OF THE INVENTION

According to a first aspect of the present invention, a semiconductor device comprises first and second MOS transistors having different conductive types of which main current flows in a lateral direction and being disposed on a SOI substrate constructed by having on a support substrate a buried oxide film and a SOI layer, wherein the potential of a control electrode of the second MOS transistor is controlled according to a potential based on the main current of the first MOS transistor, to control on-off operation of the second MOS transistor, the semiconductor device further comprising in the SOI layer an isolation structure for electrically isolating the first and second MOS transistors in order to cut off a passage through which the main current of the first MOS transistor passes a region for forming the second MOS transistor and flows into a first main electrode of the second MOS transistor.

According to a second aspect of the invention, (i) the first MOS transistor comprises: a first main electrode having a linear shape in plan configuration; a linear shape control electrode having a length not exceeding the length of the first main electrode and being disposed parallel to the first main electrode; and a linear shape second main electrode having the same length as the control electrode and being disposed parallel to the control electrode, (ii) the first main electrode of the second MOS transistor has a plan configuration of an elongated annulus ring surrounding, as its midportion, the first main electrode of the first MOS transistor and enclosing the first MOS transistor, the second MOS transistor comprising: a control electrode disposed along the inside of the elongated annulus ring; and a second main electrode provided in common to the first main electrode of the first MOS transistor, (iii) the isolation structure comprises: isolation regions disposed on both ends of the control electrode and both ends of the second main electrode of the first MOS transistor, so as to extend, between one ends and the other ends of the control electrode and the second main electrode of the first MOS transistor, (iv) the isolation regions comprise: plural trenches of which contour is defined by an impurity region for PN junction isolation, and which are disposed in the impurity region and reach the buried oxide film constituting the SOI substrate, and (v) the plural trenches are arranged in at least one line from the first main electrode to the second main electrode of the first MOS transistor, each of the plural trenches having: an inner wall oxide film covering the inner wall; and a conductor buried in a region surrounded by the inner wall oxide film.

According to a third aspect of the invention, the semiconductor device further comprises: plural multi-field plates disposed coaxially around the first main electrode of the first MOS transistor on an upper portion of the SOI layer that is provided inside the first main electrode of the second MOS transistor, wherein a trench width and a trench interval along the direction of array of the plural trenches are set so as to substantially match a plate width and a plate interval along the direction of array of the multi-field plates.

According to a fourth aspect of the invention, (i) the first MOS transistor comprises: a first main electrode being at the center of a coaxial structure; a control electrode surrounding the first main electrode; and a second main electrode surrounding the control electrode, (ii) the second MOS transistor comprises: the first main electrode being at the outermost periphery of coaxial structure; a second main electrode being at the center of coaxial structure; and a control electrode disposed along the inside of the first main electrode, (iii) the isolation structure comprises: a first trench isolation wall reaching the buried oxide film and being disposed in the SOI layer so as to surround the first MOS transistor; and a second trench isolation wall reaching the buried oxide film and being disposed in the SOI layer so as to surround the second MOS transistor, each of the first and second trench isolation walls having: an inner wall oxide film covering the inner wall; and a conductor buried in a region surrounded by the inner wall oxide film.

According to a fifth aspect of the invention, (i) the first MOS transistor comprises: a first main electrode being at the outermost periphery of a coaxial structure; a control electrode disposed along the inside of the first main electrode; and a second main electrode being at the center of the coaxial structure, (ii) the second MOS transistor comprises: a first main electrode being at the outermost periphery of coaxial structure; a second main electrode being at the center of coaxial structure; and a control electrode disposed along the inside of the first main electrode, (iii) the isolation structure comprises: first and second trench isolation walls reaching the buried oxide film and being disposed in the SOI layer so as to surround a high side region of a relatively high potential and the second MOS transistor, each of the first and second trench isolation walls having: an inner wall oxide film covering the inner wall; and a conductor buried in a region surrounded by the inner wall oxide film, and the first MOS transistor being disposed in the high side region.

According to a sixth aspect of the invention, (i) the first MOS transistor comprises: a first main electrode having a linear shape in plan configuration; a linear shape control electrode disposed parallel to the first main electrode and having a length not exceeding the length of the first main electrode; and a linear shape second main electrode disposed parallel to the control electrode and having the same length as the control electrode, (ii) the second MOS transistor comprises: the first main electrode being at the outermost periphery of a coaxial structure; a second main electrode being at the center of the coaxial structure; and a control electrode disposed along the inside of the first main electrode, (iii) the isolation structure comprises: first and second trench isolation walls reaching the buried oxide film and being disposed in the SOI layer so as to surround a high side region of a relatively high potential and the second MOS transistor, the first MOS transistor being disposed in the high side region, each of the first and second trench isolation walls having: an inner wall oxide film covering the inner wall; and a conductor buried in a region surrounded by the inner wall oxide film, the first trench isolation wall having: side surface isolation walls disposed on both end portions of the first main electrode, the control electrode and the second main electrode of the first MOS transistor, so as to extend between one end portions and between the other end portions of the first main electrode, the control electrode and the second main electrode of the first MOS transistor; and first and second isolation walls disposed outside of the first and second main electrodes of the first MOS transistor, and the first MOS transistor being surrounded by the side surface isolation walls and the first and second isolation walls.

According to a seventh aspect of the invention, the side surface isolation walls have: plural trenches disposed at a predetermined interval so as to be parallel to each electrode of the first MOS transistor, each of the trenches having: the inner wall oxide film; and the conductor buried in a region surrounded by the inner wall oxide film, and each one end of the plural trenches being arranged along the peripheral portion of the region for forming the first MOS transistor.

According to an eighth aspect of the invention, the side surface isolation walls have: plural first trenches arranged at predetermined interval so as to be parallel to each electrode of the first MOS transistor; and plural second trenches of a rectangle shape in plan configuration disposed at the peripheral portion of the array of the plural first trenches, each of the plural first and second trenches having: the inner wall oxide film; and the conductor buried in the region surrounded by the inner wall oxide film, each one end of the plural first trenches being arranged along the peripheral portion of the region for forming the first MOS transistor, the plural second trenches being disposed so as to block the end portion of the SOI layer among the plural first trenches, the inner wall oxide film of the plural first trenches and the inner wall oxide film of the plural second trenches being joined and integral with each other.

According to a ninth aspect of the invention, the second main electrode of the first MOS transistor is connected via a first resistance component to the control electrode of the second MOS transistor, and the control electrode of the second MOS transistor is connected via a second resistance component to the first main electrode of the second MOS transistor.

In the semiconductor device of the first aspect, the isolation structure is provided in order to prevent that the main current of the first MOS transistor flows through the region for forming the second MOS transistor to the first main electrode. Therefore, holes and electrons that are carriers constituting the main current of the first and second MOS transistors are isolated from each other by the isolation structure. This enables to suppress an occurrence of modulation thereby to prevent latch-up of parasitic thyristor even if hole and electrons are obtained at a high density.

In the semiconductor device of the second aspect, at least a plurality of trenches aligned in a line are disposed from the first main electrode side to the second main electrode side of the first MOS transistor in the impurity region for PN junction isolation of the isolation region, in such a shape that the first MOS transistor is included in the region for forming the second MOS transistor. Therefore, when a forward blocking voltage is applied, the field occurred between the first and second main electrodes passes and distributes via the inner wall oxide film of each trench. Thereby, each trench can bear its proportionate share of the total field and the field concentration in the isolation region can be relaxed to stabilize breakdown voltage characteristic.

In the semiconductor device of the third aspect, the trench width and trench interval along the direction of array of plural trenches are set so as to substantially match the plate width and plate interval along the direction of array of multi-field plates. Therefore, the field distribution distributed by the trenches is also maintained by the multi-field plates, and the field concentration in the isolation region can be further relaxed in combination of the multi-field plates.

In the semiconductor device of the fourth aspect, the first and second MOS transistors are disposed so that these are isolated from each other, and these transistors are electrically isolated by the first and second trench isolation walls. Therefore, holes and electrons that are carriers constituting the main current of the first and second MOS transistors are isolated from one another by the isolation structure, and an occurrence of modulation can be suppressed even if holes and electrons are obtained at a high density. In addition, since the first and second MOS transistors are isolated for electrical isolation, no parasitic thyristor structure is present and latch-up can be principally prevented to allow for an improvement in resistance to latch-up.

In the semiconductor device of the fifth aspect, the first and second MOS transistors are disposed so that these are isolated from each other, and the first MOS transistor is disposed in the high side region surrounded by the first trench isolation wall and the second MOS transistor is surrounded by the second trench isolation wall so that these transistors are electrically isolated. Therefore, holes and electrons that are carriers constituting the main current of the first and second MOS transistors are isolated from one another by the isolation structure, and an occurrence of modulation can be suppressed even if holes and electrons are obtained at a high density. Further, since the first and second MOS transistors are isolated for electrical isolation, no parasitic thyristor structure is present and latch-up can be principally prevented to allow for an improvement in resistance to latch-up. Furthermore, since the first MOS transistor is formed in the high side region, it is unnecessary to provide a trench isolation wall for electrically isolating the first MOS transistor, thereby increasing the integration degree of the semiconductor device.

In the semiconductor device of the sixth aspect, the first and second MOS transistors are disposed so that these are isolated from each other, and the first MOS transistor is buried in the first trench isolation wall in the high side region surrounded by the first trench isolation wall so that it is electrically isolated. Therefore, holes and electrons that are carriers constituting the main current of the first and second MOS transistors are isolated from one another by the isolation structure, and an occurrence of modulation can be suppressed even if holes and electrons are obtained at a high density. Further, since the first and second MOS transistors are isolated for electrical isolation, no parasitic thyristor structure is present and latch-up can be principally prevented to allow for an improvement in resistance to latch-up. Furthermore, since the first MOS transistor is disposed so as to be buried in the first trench isolation wall, the area occupied by the first MOS transistor is reduced to increase the integration degree of the semiconductor device.

In the semiconductor device of the seventh aspect, when a forward blocking voltage is applied, the field occurred between the first and second main electrodes is distributed through the inner wall oxide film of each trench constituting the side surface isolation wall, and the field is distributed substantially uniformly between the first and second main electrodes of the first MOS transistor. Thereby, no field concentration is present on the side surface isolation wall and the field concentration can be relaxed to stabilize breakdown voltage characteristic.

In the semiconductor device of the eighth aspect, the plural second trenches are arranged so as to block the end portion of the SOI layer interposing the plural first trenches, and the inner wall oxide film of the first trenches and that of the second trenches are joined and integral with each other. It is therefore avoided that during on-operation, carriers moving between the first and second main electrodes of the first MOS transistor are diffused into the SOI layer among the plural first trenches, thereby preventing an increase in switching loss.

In the semiconductor device of the ninth aspect, the main current of the first MOS transistor passes from the second main electrode to the first main electrode of the second MOS transistor via the first and second resistance components. During this, when the potential difference occurred in the first and second resistance components becomes a predetermined value, the control electrode of the second MOS transistor is controlled thereby to control on-off operation of the second MOS transistor.

It is an object of the present invention to overcome the foregoing drawback by providing a DAD that improves resistance to latch-up and stabilizes breakdown voltage characteristic.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram illustrating a partial sectional configuration of the semiconductor device of the first preferred embodiment;

FIGS. 6 to 9 are sectional views illustrating a sequence of steps in a method of manufacturing a multi-trench;

FIG. 15 is a plan view illustrating a modified arraying state of multi-field plates;

FIGS. 22 and 23 are diagrams illustrating part of a plan configuration of the semiconductor device of the fourth preferred embodiment;

FIG. 24 is a diagram illustrating the effect of the semiconductor device of the fourth preferred embodiment;

FIG. 25 is a diagram illustrating a problem caused unless the configuration of the semiconductor device of the fourth preferred embodiment is adopted;

FIGS. 28 and 29 are diagrams illustrating the steps in a method of manufacturing the modification of the semiconductor device in the fourth preferred embodiment;

DESCRIPTION OF THE PREFERRED EMBODIMENTS

A. First Preferred Embodiment

A-1. Device Configuration

As a first preferred embodiment of the present invention, a configuration of a P channel DAD (dual action device) 1000 will be described by referring to FIGS. 1 to 4.

A1-1. Plan Configuration

Figure 1:
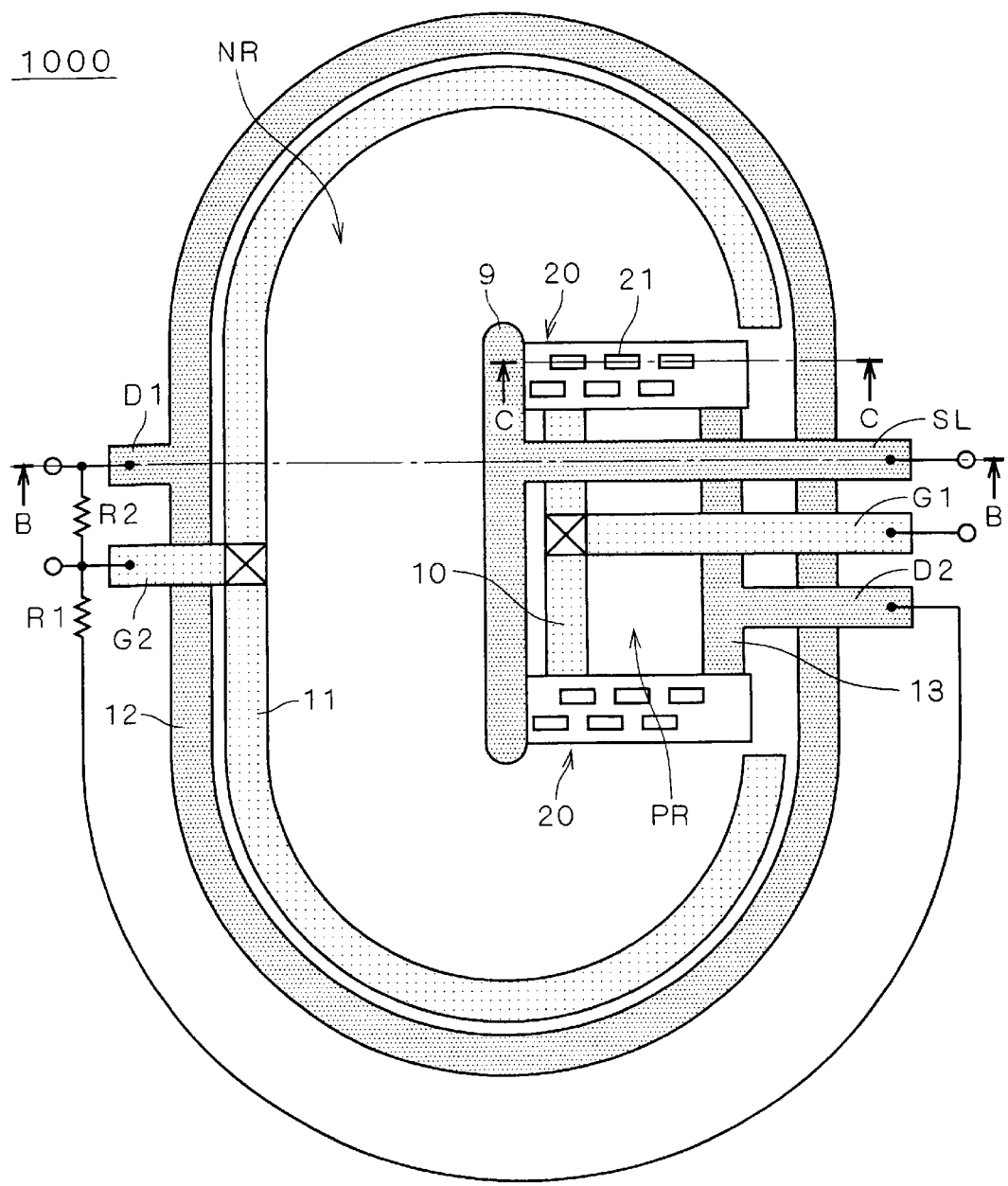
FIG. 1 is a diagram illustrating a plan configuration of a semiconductor device according to a first preferred embodiment of the invention.

FIG. 1 is a diagram illustrating a plan configuration of the P channel DAD 1000. As shown in FIG. 1, the P channel DAD 1000 has a linear source electrode 9 at its midportion. A first drain electrode 12 in the shape of an elongated annulus ring is disposed so as to surround the source electrode 9. A second gate electrode 11 of a C-shape is disposed along the inner periphery of the first drain electrode 12.

A first gate electrode 10 is located parallel to the source electrode 9, and a second drain electrode 13 is located parallel to the first gate electrode 10. The first gate electrode 10 and second drain electrode 13 are linear electrodes having a length not exceeding the length of the source electrode 9, and an isolation region 20 (isolation structure) is disposed at both ends of these electrodes. A region surrounded by two isolation regions 20 and the source electrode 9 becomes a P channel MOS region PR where a P channel MOS transistor is to be formed.

There are the following layout features. Firstly, the second gate electrode 11 has its end in the front of the two isolation regions 20, and the P channel MOS region extends from a C-shape opening to its inside.

An N channel MOS transistor is formed by the source electrode 9, second gate electrode 11 and first drain electrode 12, each surrounding the source electrode 9. An N channel MOS region NR is disposed so as to surround three sides of the P channel MOS region PR.

A source wiring SL, first gate wiring G1 and second drain wiring D2 are connected to the source electrode 9, first gate electrode 10 and second drain electrode 13, respectively.

The source wiring SL and first gate wiring G1 are for example composed of a second layer aluminum wiring. The source wiring SL is disposed so as to overlap the upper surface of the first gate electrode 10 and second drain electrode 13. The first gate wiring G1 is disposed so as to overlap the upper surface of the second drain electrode 13.

A second gate wiring G2 and first drain wiring D1 are connected to the second gate electrode 11 and first drain electrode 12, respectively. The second gate wiring G1 is for example composed of a second layer aluminum wiring, and the second drain wiring D2 is for example composed of a first layer aluminum wiring.

The second drain wiring D2 is electrically connected via a resistance R1 to the second gate wiring G2, and the second gate wiring G2 is electrically connected via a resistance R2 to the first drain wiring D1.

The first and second gate electrodes 10 and 11 are composed of a doped polysilicon containing impurity, and the first and second gate wiring G1 and G2 are connected to each other via a contact hole.

The isolation region 20 has a multi-trench structure that a plurality of trenches 21 are disposed in a P type impurity region so as to be approximately rectangle in plan configuration. Each trench 21 is filled with a conductor such as polysilicon, and each of the filled conductor is formed without making electrical contact with any specific part. The construction of the isolation region 20 will be fully described later.

A-1-2. Sectional Configuration of Major Parts

Figure 2:
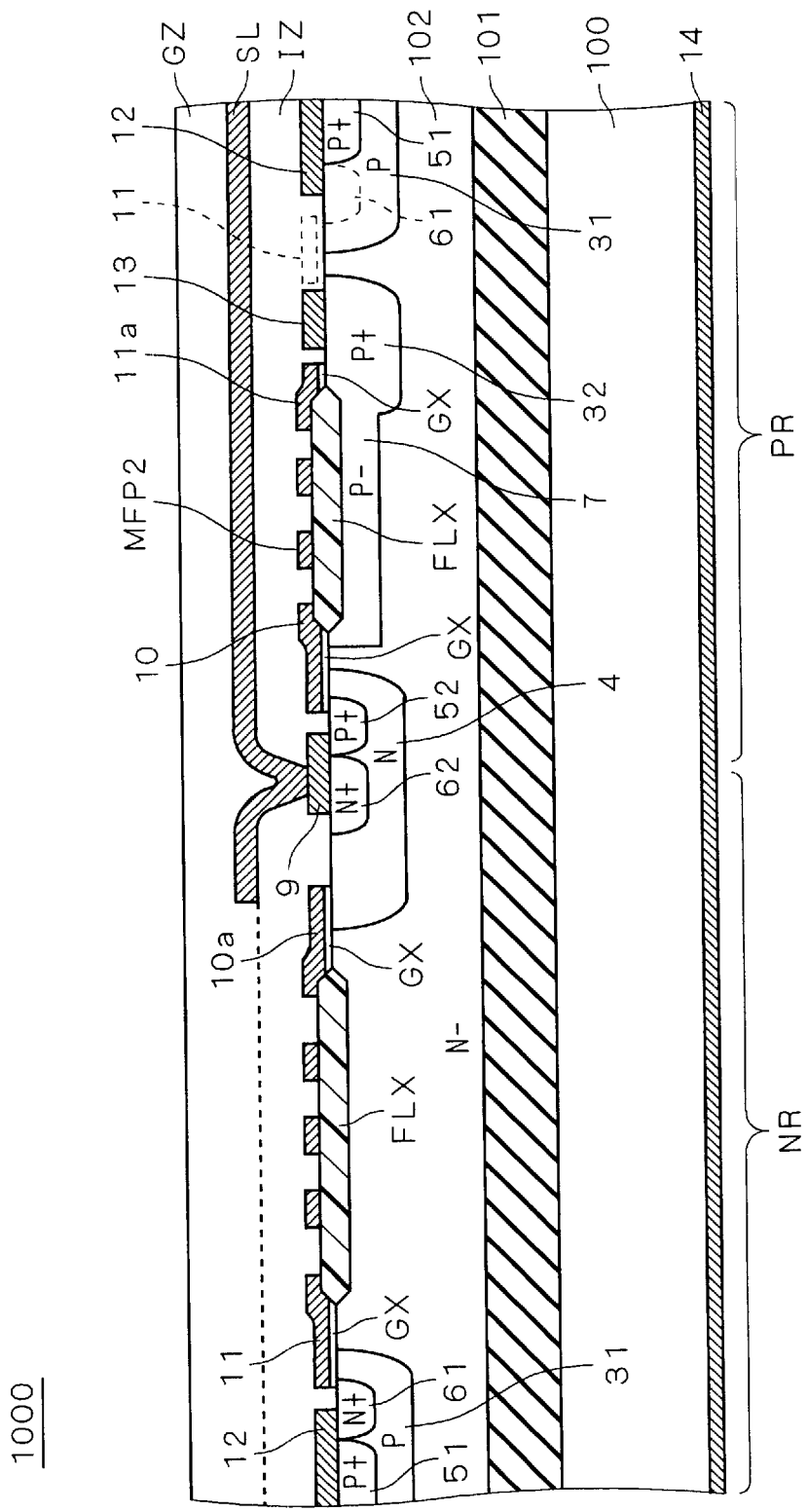
FIG. 2 is a diagram illustrating a sectional configuration of the semiconductor device of the first preferred embodiment.

FIG. 2 illustrates a sectional configuration taken along the line B—B in FIG. 1. As shown in FIG. 2, the P channel DAD 1000 is formed on a SOI substrate in which a buried oxide film 101 and a SOI layer 102 having a relatively low concentration of an N type impurity (i.e., N⁻) are disposed on a support substrate 100 such as a silicon substrate.

Looking from the lefthand of FIG. 2, a P type well region 31, an N type well region 4 and a P type well region 32 having a relatively high concentration of a P type impurity (i.e., P⁺) are disposed in the surface of the SOI layer 102 so that these regions are isolated from one another. The P type well regions 31 on the right and left ends correspond to a cross section of a continuous impurity region in the shape of an elongated annulus ring in plan configuration.

Between the P type well region 32 and N type well region 4, a P type drain region 7 having a relatively low concentration of a P type impurity (i.e., P⁻) is formed so as to be continuous with the P type well region 32. The P type drain region 7 is formed at a shallower position than the P type well region 32.

Looking from the lefthand of FIG. 2, a P type diffusion region 51 having a relatively high concentration of a P type impurity (i.e., P⁺) and an N type diffusion region 61 having a relatively high concentration of an N type impurity (i.e., N⁺) are disposed adjacent each other in the surface of the P type well region 31 on the left side as viewed in FIG. 2. Looking from the lefthand of FIG. 2, an N type diffusion region 62 (i.e., N⁺) and a P type diffusion region 52 (i.e., P⁺) are disposed adjacent each other in the surface of the N type well region 4. A P type diffusion region 51 is disposed in the surface of the P type well region 31 on the right side as viewed in FIG. 2.

A field oxide film FLX is disposed on the surface of the SOI layer 102 between the P type well region 31 and N type well region 4. The field oxide film FLX is also disposed on the surface of the P type drain region 7 and P type well region 32.

Disposed on the field oxide film FLX is a multi-field plate MFP2. The construction of the multi-field plate MFP2 will be fully described later.

Disposed on a first main surface of the SOI layer 102 are first and second drain electrodes 12, 13 and a source electrode 9. The first drain electrode 12 is formed in contact with the upper surface of the P type diffusion region 51 and N type diffusion region 61 in order to cause a short-circuit therebetween. The second drain electrode 13 is formed in contact with the upper surface of the P type well region 32. The source electrode 9 is formed in contact with the upper surface of the P type diffusion region 52 and N type diffusion region 62 in order to cause a short-circuit therebetween.

As an insulating gate electrode, a first gate electrode 10 is disposed so as to cover the area from the upper surface of the peripheral portion of the P type drain region 7, the upper surface of SOI layer 102 (between the P type drain region 7 and N type well region 4), the upper surface of the N type well region 4, and to the upper surface of the peripheral portion of the P type diffusion region 52. A second gate electrode 11 is disposed so as to cover the area from the upper surface of the peripheral portion of the N type diffusion region 61, the upper surface of the P type well region 31, and to the upper surface of the SOI layer 102. The first and second gate electrodes 10 and 11 are composed of polysilicon and are isolated from each other by a gate insulating film GX. Both electrodes 10 and 11 are partially in engagement with the end portion of the field oxide film FLX.

Disposed on the P type well region 32 between the second drain electrode 13 and field oxide film FLX is a gate electrode 11a formed in the same step as the second gate electrode 11. A gate electrode 10a formed in the same step as the first gate electrode 10 is disposed so as to cover the area from the upper surface of the peripheral portion of the N type well region 4 to the upper surface of the SOI layer 102. The gate electrodes 10a and 11a are isolated from each other by the gate insulating film GX and are partially in engagement with the end portion of the field oxide film FLX.

An interlayer insulating film IZ is disposed so as to cover the first main surface of the SOI layer 102. The interlayer insulating film IZ has an opening at the upper part of the source electrode 9. The source wiring SL is in contact with the source electrode 9 at this opening, and is disposed on the upper surface of the interlayer insulating film IZ.

A protection film GZ such as of glass is disposed so as to cover the interlayer insulating film IZ and source wiring SL.

A back side electrode 14 extends over the entire surface of a second main surface of the support substrate 100.

A-1-3. Sectional Configuration of Isolation Region

FIG. 3 illustrates a sectional configuration taken along the line C—C in FIG. 1, that is, a sectional configuration of the isolation region 20. As shown in FIG. 3, the isolation region 20 has a multi-trench structure made up of a P type impurity region 33 having a relatively high concentration of a P type impurity (P$^+$) which is disposed in the surface of the SOI layer 102 surrounded by the N type well region 4 and P type well region 31 so as to reach the buried oxide film 101, and a plurality of trenches 21 disposed so as to extend through the P type impurity region 33.

The P type impurity region 33 is an impurity region for PN junction isolation, and an electrical isolation between the P channel MOS region PR and N channel MOS region NR is accomplished by the PN junction isolation. The region thus disposed defines the contour of the isolation region 20.

The wall surface of each trench 21 is covered with an inner wall oxide film 211, and a region surrounded by the inner wall film 211 is filled with a conductor 212 such as a doped polysilicon.

A field oxide film FLX is disposed on the surface of the P type impurity region 33 so as to cover the multi-trench structure part. Disposed on the field oxide film FLX is a multi-field plate MFP2 composed of polysilicon.

Gate electrodes 10a and 11a are disposed so as to be engaged with the end portion of the field oxide film FLX. However, the gate electrode 10a is not electrically connected to the first gate electrode 10, but it is connected to the source electrode 9 or brought into a floating state. The gate electrode 11a is not electrically connected to the second gate electrode 11 but is connected to the first drain electrode 12 or brought into a floating state.

This construction is aimed at using the gate electrodes 10a and 11a as a field plate for field relaxation. Since no function as a MOS device is needed in the N type well region 4 and P type well region 31 that surround the isolation region 20, the P type diffusion region 52 and N type diffusion region 61 are also unnecessary, which are however indicated by broken lines in FIG. 3, for the sake of positional relation.

An interlayer insulating film IZ is disposed so as to cover the upper surface of the isolation region 20, and a multi-field plate MFP1 is disposed on the interlayer insulating film IZ. Like the source electrode 9 and first drain electrode 12, the multi-field plate MFP1 is composed of metal such as aluminum and is disposed so as to cover the upper part of the clearance of the multi-field plate MFP2.

Otherwise, the construction is identical to that shown in the sectional configuration of FIG. 2. The same reference numerals are used for similar parts and a description thereof is thus omitted.

A-2. Operation

Operation of the P channel DAD 1000 will be described by referring to FIGS. 1 to 3.

On-off operation of the P channel DAD 1000 is basically identical with that of the conventional P channel DAD 900. At the time of on-operation, in the P channel MOS region PR, holes are injected from the P type diffusion region 52 to the P type drain region 7, through a P type channel formed in the surface of the N type well region 4 and SOI layer 102 which are located immediately below the first gate electrode 10. Then the holes flow into the second drain electrode 13 and then pass through the second drain wiring D2 to the first drain electrode 12.

When the potential difference in the resistances R1 and R2 occurred due to hole current becomes a predetermined value, the second gate electrode 11 functions as a gate, and electrons are injected from the N type diffusion region 61 to the SOI layer 102, through an N channel formed in the surface of the P type well region 31 immediately underlying the second gate electrode 11. Then the injected electrons reach the source electrode 109 via the N type well region 4 and N type diffusion region 62. On the other hand, the P channel MOS region PR is electrically isolated from the N channel MOS region NR by the isolation region 20, and no holes flow straight down into the N channel MOS region NR, and no electrons flow straight down into the P channel MOS region PR. By the isolation region 20, holes and electrons are isolated from one another, and an occurrence of modulation can be suppressed even if holes and electrons are obtained at a high density.

In the isolation region 20, by virtue of the multi-trench structure, each trench 21 can bear its proportionate share of the total field between source and drain occurred when a forward blocking voltage is applied. This enables to relax the field concentration in the isolation region 20.

In addition, the field concentration in the isolation region 20 can be further relaxed in combination with a multi-field plate.

A-3. Multi-Trench Structure and Multi-Field Plate

A multi-trench structure and multi-field plate will be described by referring to FIGS. 4 to 15.

Figure 4:
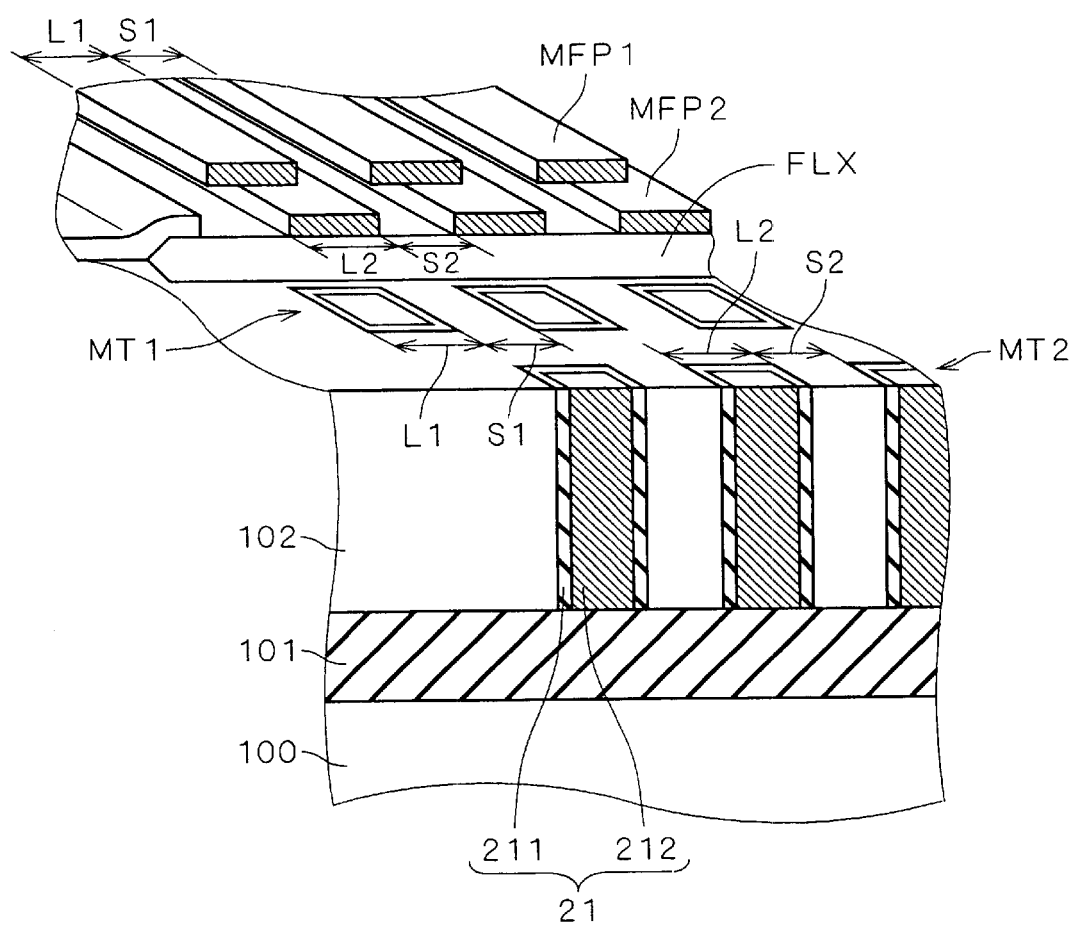
FIG. 4 is a perspective view illustrating part of the configuration of the semiconductor device of the first preferred embodiment.

FIG. 4 is a perspective view of a multi-trench structure and a multi-field plate configuration.

As shown in FIG. 4, the multi-trench structure has a plurality of arrays of trenches 21 and has the arrangement such that the trenches 21 are alternately disposed between the adjacent arrays.

On a field oxide film FLX covering the upper surface of the multi-trench structure, a multi-field plate MFP2 composed of a doped polysilicon is disposed and a multi-field plate MFP1 composed of metal such as aluminum is disposed thereon. The multi-field plates MFP1 and MFP2 are arranged so as to alternate with each other.

Here, one array of the trench arrays is regarded as MT1, and the trench width (line) and trench interval (space) along the direction of array are regarded as L1 and S1, respectively.

Similarly, another array is regarded as MT2, and its line and space are regarded as L2 and S2, respectively.

Further, in the multi-field plates MFP1 and MFP2, the plate width (line) and plate interval (space) along the direction of array are regarded as L1 and S1; and L2 and S2, respectively. Since the trench array MT2 and multi-field plate MFP2 are matched in line and space, the field plates of the multi-field plate MFP2 overlap the upper surface of the trenches 21 of the trench array MT2, respectively. Similarly, since the trench array MT1 and multi-field plate MFP1 are matched in line and space, the field plates of the multi-field plate MFP1 overlap the upper surface of the trenches 21 of the trench array MT1, respectively.

The lines L1 and L2, and the spaces S1 and S2 may have the same numeric value. For instance, both of the lines L1 and L2 may be 10 $\mu$m to 20 $\mu$m, and both of the spaces S1 and S2 may be also 10 $\mu$m to 20 $\mu$m. In this case, the interval between the trench arrays MT1 and MT2 may be 2 $\mu$m to 3 $\mu$m when defined by the interval of the trench 21, and the length in the direction orthogonal to the line of the trenches 21 may be 2 $\mu$m to 3 $\mu$m.

The resulting effect of the multi-trench structure and multi-field plate so constructed will be described by referring to FIG. 5.

Figure 5:
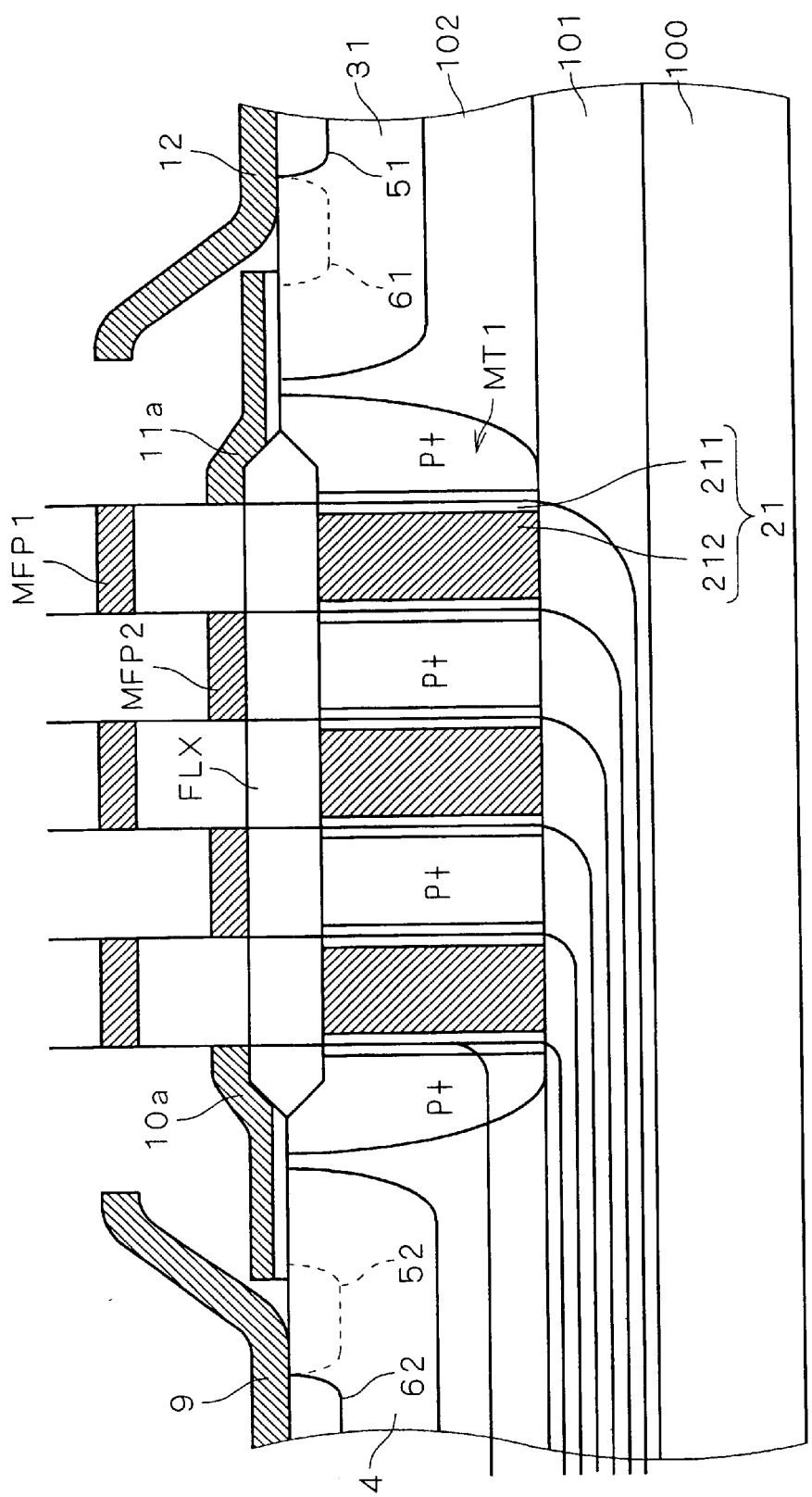
FIG. 5 is a diagram illustrating the effect of the semiconductor device of the first preferred embodiment.

FIG. 5 is a sectional view illustrating the resulting effect obtained by combining the trench array MT1 and multi-field plate MFP1. Since FIG. 5 is an enlarged view of the configuration shown in FIG. 3, the same reference numerals are used for similar parts and a description thereof is thus omitted.

Referring to FIG. 5, most of the field between source and drain occurred upon application of a forward blocking voltage passes through a buried oxide film 101 and reaches the upper surface of a field oxide film FLX via the inner wall oxide film 211 of the trench 21. At this time, because the multi-field plate MFP1 is located at the upper surface of the trench array MT1, the field extends along the peripheral portion of each plate of the multi-field plate MFP1, thereby avoiding a local field concentration.

Although the field density is high in the buried oxide film 101, the insulation strength of a silicon oxide film is not less than 10 times that of silicon, thereby to prevent deterioration in breakdown voltage characteristic due to field concentration.

Thus, by employing the inner wall oxide film 211 of the trench 21 as a field passageway, a local field concentration in the silicon layer can be prevented effectively to maintain and stabilize breakdown voltage characteristic. The presence of the isolation region 20 avoids lowering of breakdown voltage, thus allowing for a reliable improvement in latch-up characteristic.

In addition, the field distribution divided by the multi-trench structure is also maintained by the multi-field plate. Accordingly, a combination with the multi-trench structure provides a more effective prevention of a local field concentration in the silicon layer.

A-4. Method of Manufacturing Multi-Trench Structure

A method of manufacturing a multi-trench structure will be described by referring to FIGS. 6 to 9.

In the step of FIG. 6, a plurality of openings HL extending through a SOI layer 102 are formed. The openings HL may be formed so as to match the contour and array of trenches 21.

In the step of FIG. 7, a silicon oxide film OX1 is formed over the entire surface of the SOI layer 102 in a thickness of about 100 nm (1000 Angstrom), in order to form an inner wall oxide film 211 on the wall surface of the openings HL.

Figure 8:
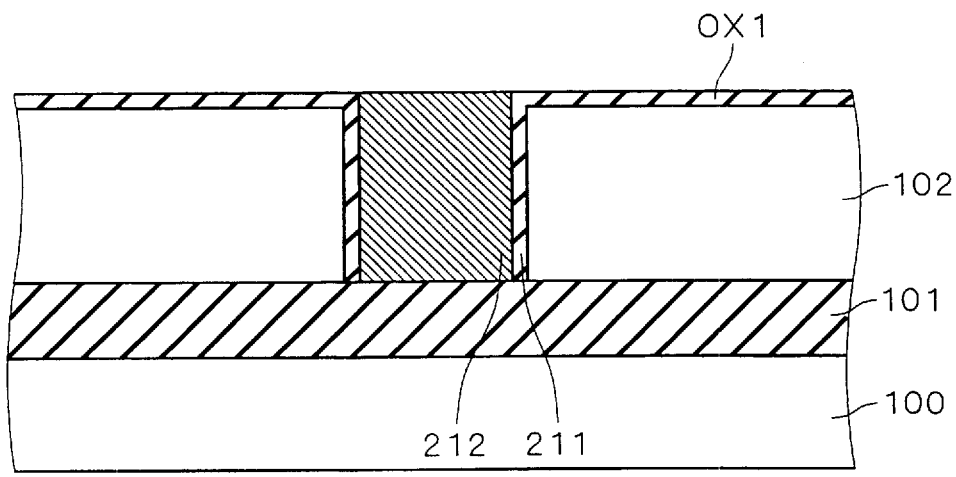
Figure 9:
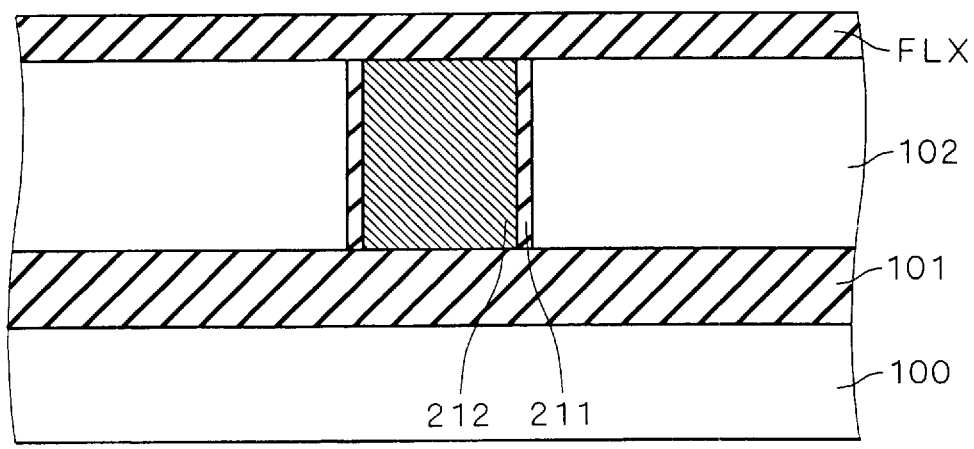

In the step of FIG. 8, a doped polysilicon 212 is formed on the entire surface and then removed by etch-back, so that the doped polysilicon 212 is left only in the openings HL.

Subsequently, the silicon oxide film OX1 on the SOI layer 102 is removed, and a field oxidation is performed to form a field oxide film FLX. This results in a configuration having a multi-trench structure beneath the field oxide film FLX.

A-5. Modification I of Multi-Field Plate

Although the foregoing description has been given of the configuration having two layers of the multi-field plates MFP1 and MFP2, without limiting to this, the multi-field plate can have one, three, or more layers.

Figure 10:
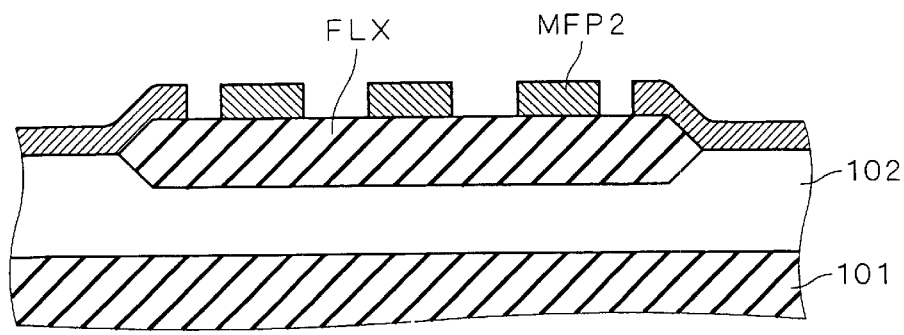
FIG. 10 is a diagram illustrating a configuration when a multi-field plate is composed of one layer.

FIG. 10 illustrates such a construction that only a multi-field plate MFP2 is disposed on a field oxide film FLX.

This construction can simplify the manufacturing steps of a multi-field plate, however, the capacitive coupling strength is lowered.

Figure 11:
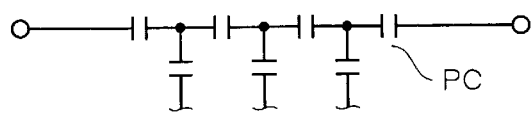
FIG. 11 is a schematic diagram illustrating the effect of the multi-field plate.

FIG. 11 illustrates a capacity component PC in the construction of FIG. 10, as an equivalent circuit.

Figure 12:
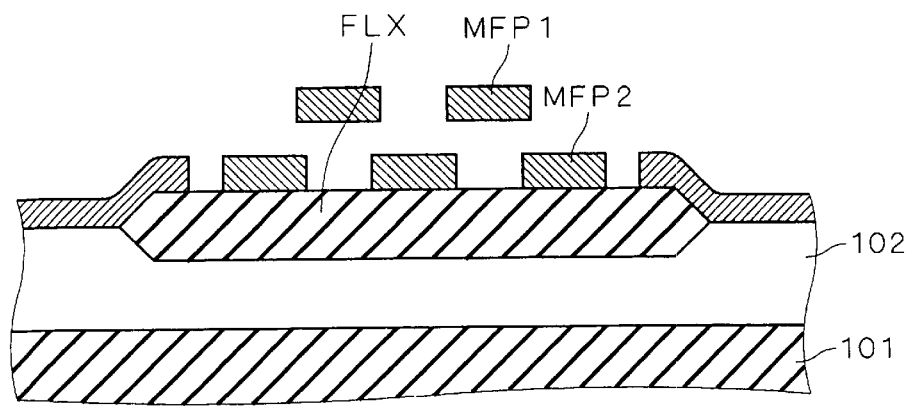
FIG. 12 is a diagram illustrating a configuration when a multi-field plate is composed of two layers.
Figure 13:
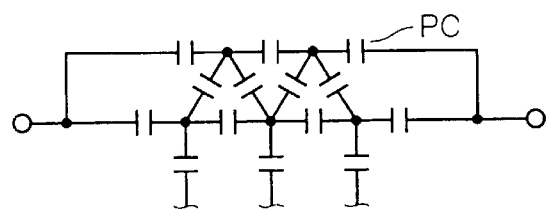
FIG. 13 is a schematic diagram illustrating the effect of the multi-field plate.

FIG. 12 illustrates such a construction that on a field oxide film FLX, a multi-field plate MFP2 is disposed and a multi-field plate MFP1 is disposed thereon. FIG. 13 illustrates a capacity component PC in the construction of FIG. 12, as an equivalent circuit.

A comparison of FIG. 11 with FIG. 13 indicates that the capacitive coupling can be reinforced tremendously by disposing a plurality of multi-field plates.

Therefore, the presence of three or more multi-field plates provides the effects of further reinforcing capacitive coupling and stabilizing breakdown voltage characteristic.

A-6. Modification II of Multi-Field Plate

Although FIGS. 3 to 5 illustrate the construction that the multi-field plates MFP1 and MFP2 overlap the upper surface of the isolation region 20, the multi-field plates MFP1 and MFP2 may not overlap the upper surface of the isolation region 20.

Specifically, in a lateral high voltage device, the multi-field plate is disposed on the field oxide film between source and drain in order to relax the field therebetween, and the area for disposing the multi-field plates is not limited to the upper surface of the isolation region 20.

Figure 14:
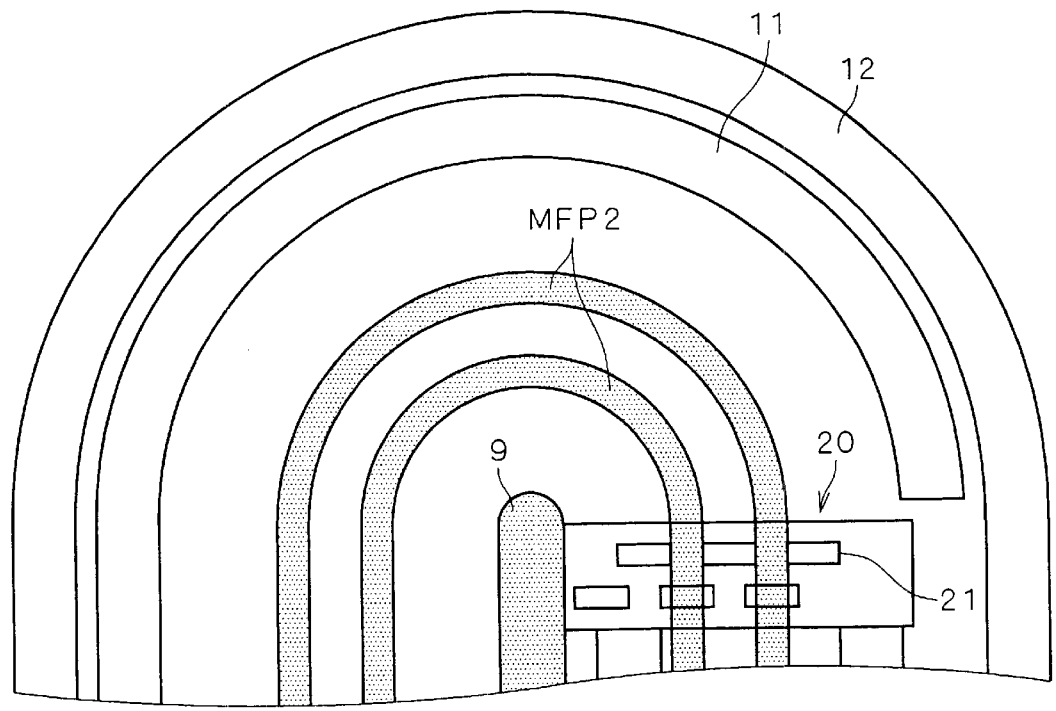
FIG. 14 is a plan view illustrating an arraying state of multi-field plates.

FIG. 14 is a partial plan view of a P channel DAD 1000, in order to show an array of multi-field plates. In FIG. 14, only a multi-field plate MFP2 is illustrated which is disposed between a source electrode 9 and a first drain electrode 12.

A field relaxation is attainable without a multi-field plate because in the isolation region 20, the field between source and drain can be relaxed by the multi-trench structure, as previously described by using FIG. 5.

In contrast, such a construction as shown in FIG. 15 is obtainable by the omission of a multi-field plate in the isolation region 20.

The construction of FIG. 15 is such that no multi-field plate is formed on the isolation region 20, multi-field plates MFPX are formed in an N channel MOS region NR, and multi-field plates MFPY are formed in a P channel MOS region PR.

In the isolation region 20, a plurality of trench arrays having different contour dimensions are disposed, and the trench arrays are of different lines and spaces.

In FIG. 15, three types of arrays of trenches 21a, trenches 21b and trenches 21c are illustrated, and it is arranged so that the line of the trenches 21a that is the nearest to the N channel MOS region NR (the trench width along the direction of array) is the longest one, and the line of the trenches 21c that is the nearest to the P channel MOS region PR is the shortest one.

It is so set that the plate width of the multi-field plate MFPX is equivalent to that of the line of the trenches 21a, and that the plate width of the multi-field plate MFPY is equivalent to that of the line of the trenches 21c.

This construction can provide the effect that the field concentration at the boundary between the multi-field plate MFPX and the trenches 21a is relaxed to stabilize breakdown voltage characteristic.

B. Second Preferred Embodiment

B-1. Device Configuration

As a second preferred embodiment of the present invention, a configuration of a P channel DAD 2000 will be described by referring to FIGS. 16 and 17.

B-1-1. Plan Configuration

Figure 16:
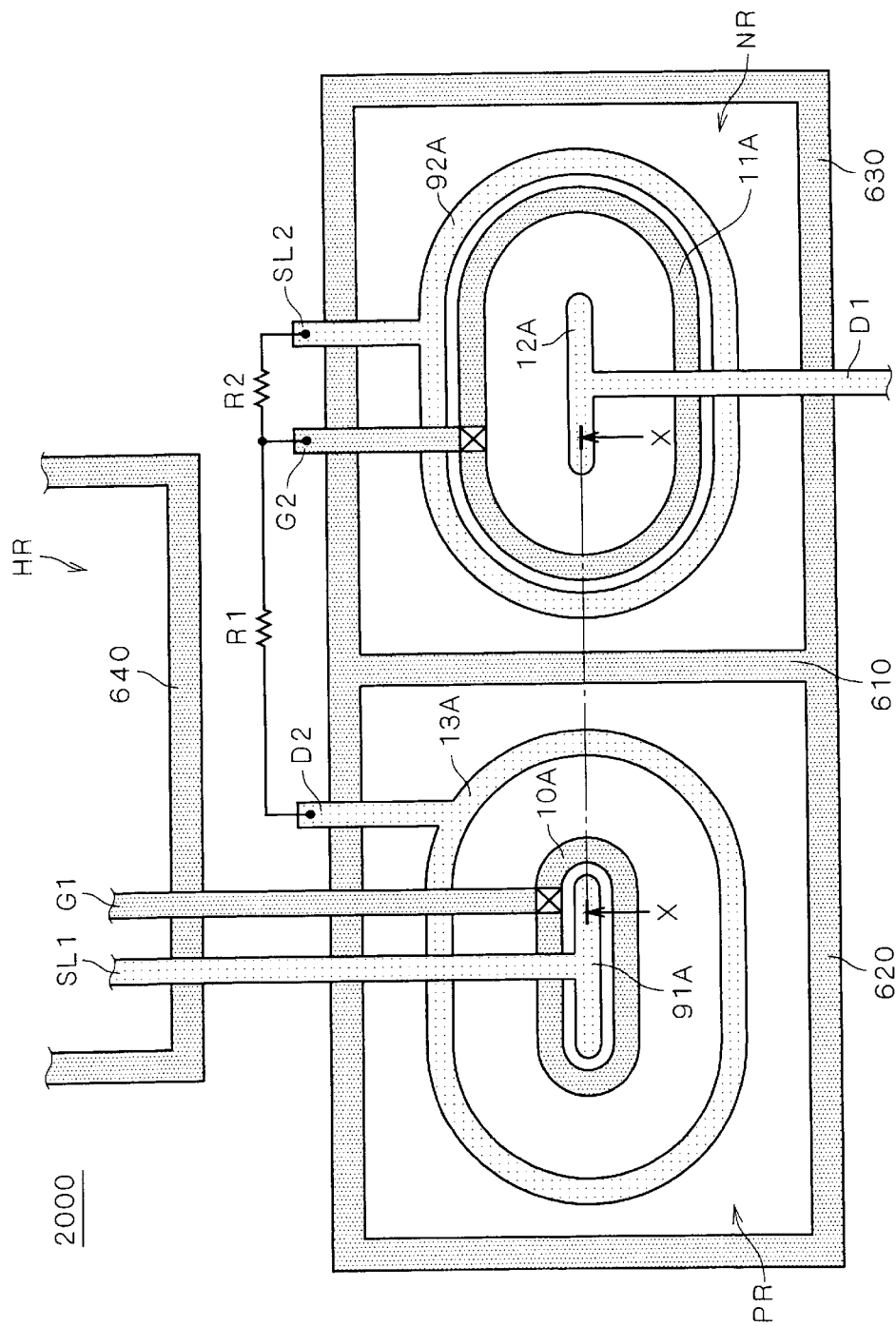
FIG. 16 is a diagram illustrating a plan configuration of a semiconductor device according to a second preferred embodiment.

FIG. 16 is a diagram illustrating a plan configuration of the P channel DAD 2000. As shown in FIG. 16, in the P channel DAD 2000, a P channel MOS region PR and an N channel MOS region NR are electrically isolated by a trench isolation wall 610. The P channel MOS region PR is surrounded and isolated by the trench isolation wall 610 and a trench isolation wall 620 (i.e., a first trench isolation wall), and the N channel MOS region NR is surrounded and isolated by the trench isolation wall 610 and a trench isolation wall 630 (i.e., a second trench isolation wall).

A high side (high potential) region HR is surrounded and isolated by a trench isolation wall 640. Since the trench isolation walls 610, 620, 630 and 640 isolate electrically the P channel MOS region PR and N channel MOS region NR, they can be called "isolation structure."

A P channel MOS transistor is formed by arranging so that in the P channel MOS region PR, a linear source electrode 91A is disposed at its midportion, a first gate electrode 10A of an elongated annulus ring is disposed so as to surround the source electrode 91A, and a second rain electrode 13A of an elongated annulus ring is disposed so as to surround the first gate electrode 10A.

A source wiring SL1, first gate wiring G1 and second drain wiring D2 are connected to the source electrode 91A, first gate electrode 10A and second drain electrode 13A, respectively.

The source wiring SL1 and first gate wiring G1 are for example composed of a second layer aluminum wiring. The source wiring SL1 overlaps the upper surface of the first gate electrode 10A and second drain electrode 13A, and the first gate wiring G1 overlaps the upper surface of the second drain electrode 13A and the upper surface of trench isolation walls 620, 640 and extends to the high side region HR.

The second drain wiring D2 is for example composed of a first layer aluminum wiring and it overlaps the upper surface of the trench isolation wall 620 and extends to the outside of the P channel MOS region PR on the high side region HR side.

An N channel MOS transistor is formed by arranging so that in the N channel MOS region NR, a linear first drain electrode 12A is disposed at its midportion, a second gate electrode 11A of an elongated annulus ring is disposed so as to surround the first drain electrode 12A, and a source electrode 92A of an elongated annulus ring is disposed so as to surround the second gate electrode 11A.

A first drain wiring D1, second gate wiring G2 and source wiring SL2 are connected to the first drain electrode 12A, second gate electrode 11A and source electrode 92A, respectively.

The source wiring SL2 and second gate wiring G2 are for example composed of a second layer aluminum wiring. The source wiring SL2 overlaps the upper surface of the trench isolation wall 620. The second gate wiring G2 overlaps the upper surface of the source electrode 92A and trench isolation wall 620 and extends to the outside of the N channel MOS region NR on the high side region HR side.

The first drain wiring D1 is for example composed of the first layer aluminum wiring and it overlaps the upper surface of the second gate electrode 11A, source electrode 92A and the upper surface of trench isolation wall 620 and extends to the outside of the N channel MOS region NR which is opposite the high side region HR.

The first and second gate electrodes 10A and 11A are composed of a doped polysilicon and are connected via a contact hole to the first and second gate wirings G1 and G2, respectively.

The second drain wiring D2 is electrically connected via a resistance R1 to the second gate wiring G2, and the second gate wiring G2 is electrically connected via a resistance R2 to the source wiring SL2.

Although in the foregoing description the P channel MOS transistor and N channel MOS transistor have a coaxial shape of an elongated annulus ring, without limiting to this shape, they may have a coaxial shape of an annulus ring or rectangular ring.

B-1-2. Sectional Configuration of Major Parts

Figure 17:
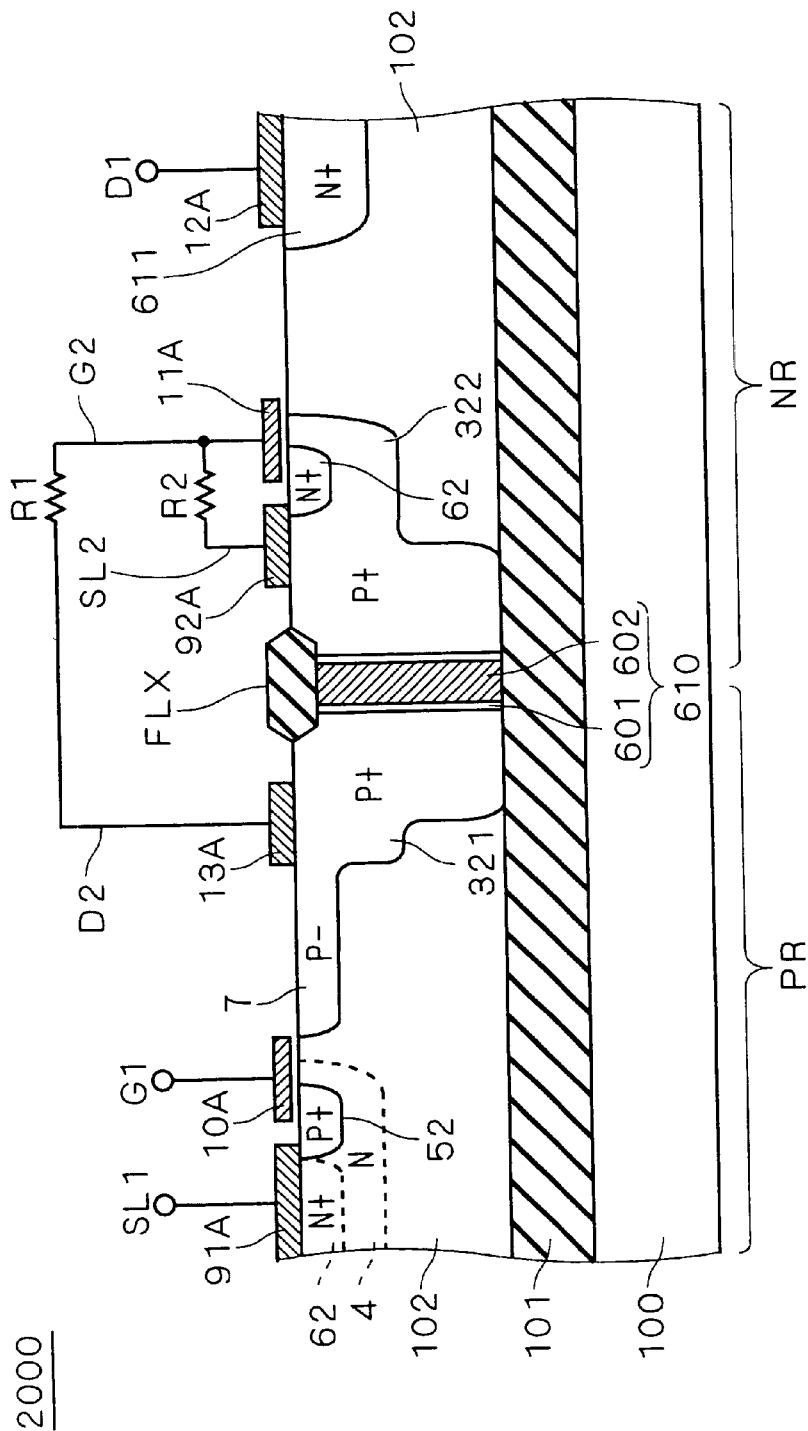
FIG. 17 is a diagram illustrating a sectional configuration of the semiconductor device of the second preferred embodiment.

FIG. 17 illustrates a sectional configuration taken along the line X—X in FIG. 16. As shown in FIG. 17, the P channel DAD 2000 is formed on a SOI substrate in which a buried oxide film 101 and a SOI layer 102 (N$^-$) are disposed on a support substrate 100 such as a silicon substrate.

In a P channel MOS region PR, looking from the lefthand of FIG. 17, an N type well region 4 and a P type well region 321 (P$^+$) are disposed in the surface of the SOI layer 102 so that these regions are isolated from each other.

Between the P type well region 321 and N type well region 4, a P type drain region 7 (P$^-$) is formed so as to be continuous with the P type well region 321. The P type drain region 7 is formed at a shallower position than the P type well region 321.

Looking from the lefthand of FIG. 17, an N type diffusion region 62 (N$^+$) and a P type diffusion region 52 (P$^+$) are disposed adjacent each other in the surface of the N type well region 4. Since the N type well region 4 and N type diffusion region 62 (N$^+$) are not necessarily required, these are indicated by broken lines.

Disposed on a first main surface of the SOI layer 102 are a source electrode 91A, second drain electrode 13A and first gate electrode 10A. The source electrode 91A is formed in contact with the upper surface of the P type diffusion region 52 and N type diffusion region 62 in order to cause a short-circuit therebetween. The second drain electrode 13A is formed in contact with the upper surface of the P type well region 321. The first gate electrode 10A is disposed as an insulating gate electrode, so as to cover the area from the upper surface of the peripheral portion of the P type drain region 7, the upper surface of the SOI layer 102 (between the P type drain region 7 and N type well region 4), the upper surface of the N type well region 4, and to the upper surface of the peripheral portion of the P type diffusion region 52.

In an N channel MOS region NR, looking from the righthand of FIG. 17, an N type well region 611 (N$^+$) and a P type well region 322 (P$^+$) are disposed in the surface of the SOI layer 102 so that these regions are isolated from each other.

An N type diffusion region 62 (N$^+$) is disposed in the surface of the P type well region 322.

Disposed on the first main surface of the SOI layer 102 are a source electrode 92A, first drain electrode 12A and second gate electrode 11A. The source electrode 92A is formed in contact with the upper surface of the N type diffusion region 62 and P type well region 322 in order to cause a short-circuit therebetween. The first drain electrode 12A is formed in contact with the upper surface of the N type well region 611. The second gate electrode 11A is disposed as an insulating gate electrode, so as to cover the area from the upper surface of the peripheral portion of the N type diffusion region 62, the upper surface of the P type well region 322, and to the upper surface of the SOI layer 102.

A field oxide film is disposed on the surface of the SOI layer between the P type well region 322 and N type well region 611. The field oxide film is also disposed on the surface of the P type drain region 7 and P type well region 32, and multi-field plates (not shown) are disposed thereon.

The trench isolation wall 610 between the N channel MOS region NR and P channel MOS region PR is constructed so that the inner wall of the trench extending through the SOI layer 102 to the buried oxide film 101 is covered with an inner wall oxide film 601, and a conductor 602 such as a doped polysilicon is buried in a region surrounded by the inner wall oxide film 601. Disposed on the trench isolation wall 610 is a field oxide film FLX. The same is true for the trench isolation walls 620 and 630.

The side surfaces of the trench isolation wall 610 are covered with the P well region 321 or 322 reaching the buried oxide film 101. This is aimed at covering a crystal defect occurred in the vicinity of a trench, in order to avoid that a leak current due to the crystal defect flows in the device.

B-2. Operation

Operation of the P channel DAD 2000 will be described by referring to FIGS. 16 and 17.

In on-operation of the P channel DAD 2000, when a gate signal from the high side region HR is supplied to the first gate electrode 10A, in the P channel MOS region PR, holes are injected from the P type diffusion region 52 to the P type drain region 7 through a P type channel formed in the surface of the N type well region 4 and SOI layer 102 which are located immediately below the first gate electrode 10A. Then, the holes flow into the second drain electrode 13A and pass through the second drain wiring D2 to the source electrode 92A.

When the potential difference occurred in the resistances R1 and R2 due to hole current becomes a predetermined value, the second gate electrode 11A functions as a gate. Through an N channel formed in the surface of the P type well region 322 immediately underlying the second gate electrode 11A, electrons are injected from the N type diffusion region 62 to the SOI layer 102, and the injected electrons reach the first drain electrode 12A via the N type well region 611, thereby to control the potential of the first drain electrode 12A electrically connected to a low side (low potential) region which is not shown.

Thus, the P channel MOS region PR is electrically isolated from the N channel MOS region NR, and no holes flows straight down into the N channel MOS region NR, and no electrons flows straight down into the P channel MOS region PR. Therefore, an occurrence of modulation can be suppressed even if holes and electrons are obtained at a high density.

Since a parasitic thyristor structure is present in neither the P channel MOS region PR nor the N channel MOS region NR, as shown in FIG. 17, an occurrence of latch-up can be prevented to allow for an improvement in resistance to latch-up.

C. Third Preferred Embodiment

C-1. Device Configuration

As a third preferred embodiment of the present invention, a configuration of a P channel DAD 3000 will be described by referring to FIGS. 18 and 19.

C-1-1. Plan Configuration

Figure 18:
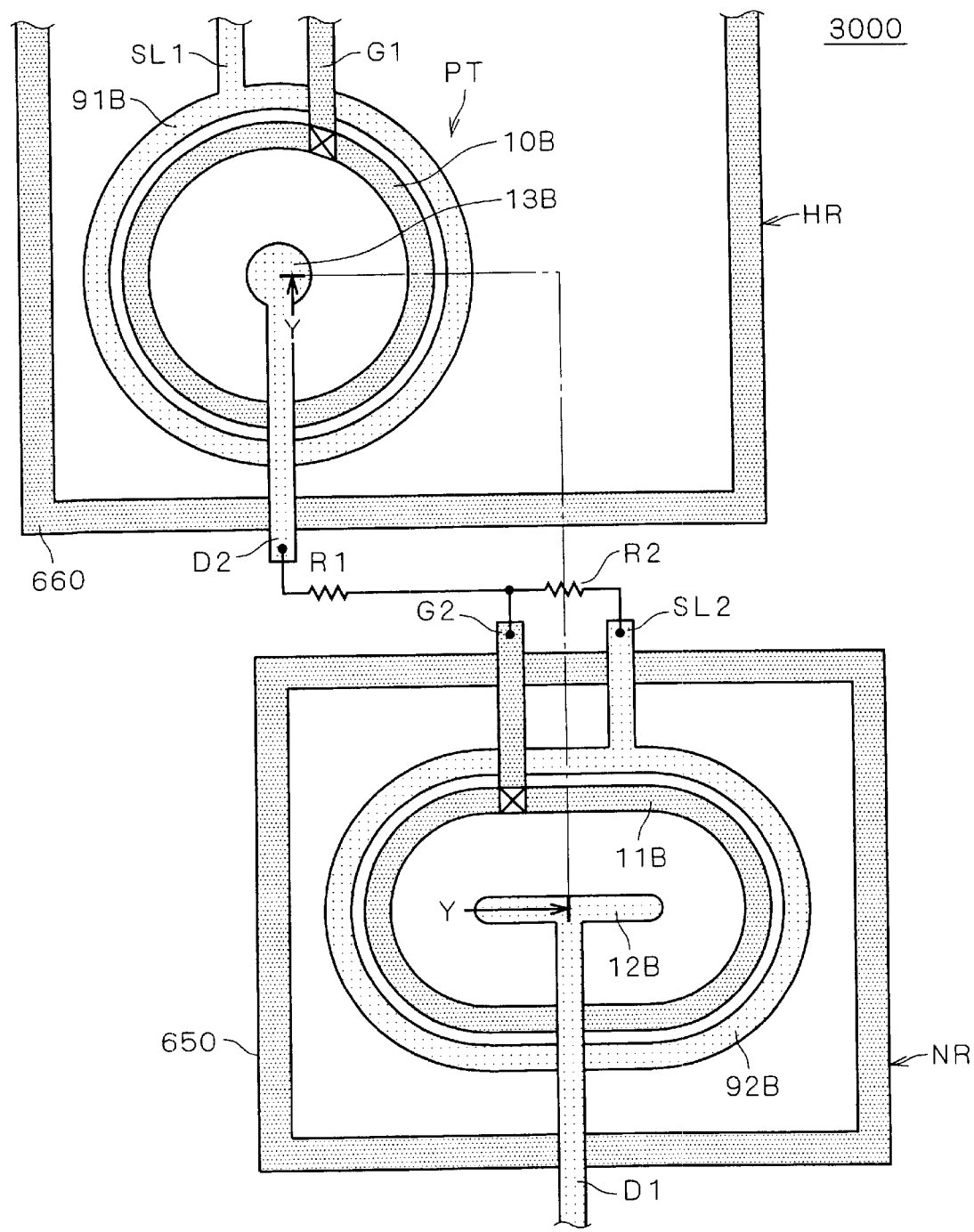
FIG. 18 is a diagram illustrating a plan configuration of a semiconductor device according to a third preferred embodiment.

FIG. 18 is a diagram illustrating a plan configuration of the P channel DAD 3000. As shown in FIG. 18, in the P channel DAD 3000, an N channel MOS region NR is surrounded and isolated by a trench isolation wall 650 (a second trench isolation wall), a P channel MOS transistor PT is formed in a high side region HR, and the high side region HR is also surrounded and isolated by a trench isolation wall 640 (a first trench isolation wall). The trench isolation walls 640 and 650 can be called "isolation structure" because these electrically isolate the P channel MOS transistor PT and N channel MOS region NR.

The P channel MOS transistor PT is formed by arranging so that a circular drain electrode 13B is disposed at the midportion, a first gate electrode 10B of an annulus ring is disposed so as to surround the drain electrode 13B, and a source electrode 91B of an annulus ring is disposed so as to surround the first gate electrode 10B.

A source wiring SL1, first gate wiring G1 and second drain wiring D2 are connected to the source electrode 91B, first gate electrode 10B and second drain electrode 13B, respectively.

The source wiring SL1 and first gate wiring G1 are for example composed of a second layer aluminum wiring. The first gate wiring G1 overlaps the upper surface of the source electrode 91B and extends into the high side region HR.

The second drain wiring D2 is for example composed of a first layer aluminum wiring and it overlaps the upper surface of the first gate electrode 10B, source electrode 91B and trench isolation wall 620 and extends to the outside of the high side region HR on the N channel MOS region NR side.

An N channel MOS transistor is formed by arranging so that in the N channel MOS region NR, a linear first drain electrode 12B is disposed at its midportion, a second gate electrode 11B of an elongated annulus ring is disposed so as to surround the first drain electrode 12B, and a source electrode 92B of an elongated annulus ring is disposed so as to surround the second gate electrode 11B.

A first drain wiring D1, second gate wiring G2 and source wiring SL2 are connected to the first drain electrode 12B, second gate electrode 11B and source electrode 92B, respectively.

The source wiring SL2 and second gate wiring G2 are for example composed of the second layer aluminum wiring. The source wiring SL2 overlaps the upper surface of the trench isolation wall 650. The second gate wiring G2 overlaps the upper surface of the source electrode 92B and trench isolation wall 650 and extends to the outside of the N channel MOS region NR on the high side region HR side.

The first drain wiring D1 is for example composed of the first layer aluminum wiring and it overlaps the upper surface of the second gate electrode 11B, source electrode 92B and trench isolation wall 650, and extends to the outside of the N channel MOS region NR which is opposite the high side region HR.

The first and second gate electrodes 10B and 11B are composed of a doped polysilicon and are connected via a contact hole to the first and second gate wirings G1 and G2, respectively.

The second drain wiring D2 is electrically connected via a resistance R1 to the second gate wiring G2, and the second gate wiring G2 is electrically connected via a resistance R2 to the source wiring SL2.

Although in the foregoing description the N channel MOS transistor has a coaxial shape of an elongated annulus ring, without limiting to this shape, it may have a coaxial shape of an annulus ring or rectangular ring.

Although in the foregoing description the P channel MOS transistor has a coaxial shape of an annulus ring, without limiting to this shape, it may have a coaxial shape of an elongated annulus ring or rectangular ring.

C-1-2. Sectional Configuration of Major Parts

Figure 19:
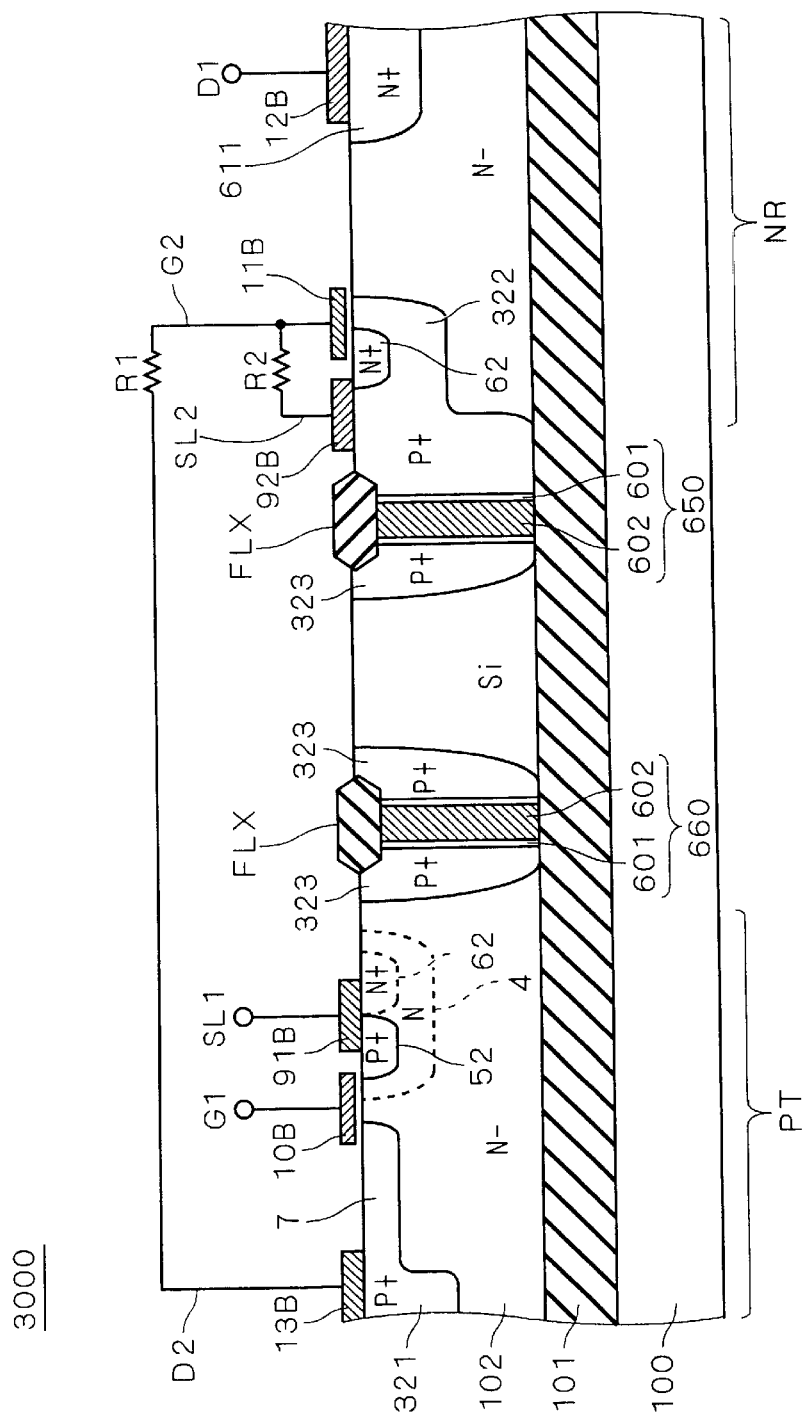
FIG. 19 is a diagram illustrating a sectional configuration of the semiconductor device of the third preferred embodiment.

FIG. 19 illustrates a sectional configuration taken along the line Y—Y in FIG. 18. As shown in FIG. 19, the P channel DAD 3000 is formed on a SOI substrate in which a buried oxide film 101 and SOI layer 102 (N$^-$) are disposed on a support substrate 100 such as a silicon substrate.

In a P channel MOS transistor PT, looking from the lefthand of FIG. 19, a P type well region 321 (P$^+$) and an N type well region 4 are disposed in the surface of the SOI layer 102 so that these regions are isolated from each other.

Between the P type well region 321 and N type well region 4, a P type drain region 7 (P$^-$) is formed so as to be continuous with the P type well region 321. The P type drain region 7 is formed at a shallower position than the P type well region 321.

Looking from the lefthand of FIG. 19, a P type diffusion region 52 (P$^+$) and an N type diffusion region 62 (N$^+$) are disposed adjacent each other in the surface of the N type well region 4. Since the N type well region 4 and N type diffusion region 62 (N$^+$) are not necessarily required, these are indicated by broken lines.

Disposed on a first main surface of the SOI layer 102 are a source electrode 91B, second drain electrode 13B and first gate electrode 10B. The source electrode 91B is formed in contact with the upper surface of the P type diffusion region 52 and the N type diffusion region 62 in order to cause a short-circuit therebetween. The second drain electrode 13B is formed in contact with the upper surface of the P type well region 321. The first gate electrode 10B is disposed as an insulating gate electrode, so as to cover the area from the upper surface of the peripheral portion of the P type drain region 7, the upper surface of the SOI layer 102 (between the P type drain region 7 and N type well region 4), the upper surface of the N type well region 4, and to the upper surface of the peripheral portion of the P type diffusion region 52.

In an N channel MOS region NR, looking from the righthand of FIG. 19, an N type well region 611 ($N^+$) and a P type well region 322 ($P^+$) are disposed in the surface of the SOI layer 102 so that these regions are isolated from each other.

An N type diffusion region 62 ($N^+$) is disposed in the surface of the P type well region 322.

Disposed on the first main surface of the SOI layer 102 are a source electrode 92B, first drain electrode 12B and second gate electrode 11B. The source electrode 92B is formed in contact with the upper surface of the N type diffusion region 62 and P type well region 322 in order to cause a short-circuit therebetween. The first drain electrode 12B is formed in contact with the upper surface of the N type well region 611. The second gate electrode 11B is disposed as an insulating gate electrode, so as to cover the area from the upper surface of the peripheral portion of the N type diffusion region 62, the upper surface of the P type well region 322, and to the upper surface of the SOI layer 102.

A field oxide film is disposed on the surface of the SOI layer 102 between the P type well region 322 and N type well region 611. The field oxide film is also disposed on the surface of the P type drain region 7 and P type well region 32, and multi-field plates (not shown) are disposed thereon.

The trench isolation walls 650 and 660 are constructed so that the inner wall of the trench extending through the SOI layer 102 to the buried oxide film 101 is covered with an inner wall oxide film 601, and a conductor 602 such as a doped polysilicon is buried in a region surrounded by the inner wall oxide film 601. Disposed on the trench isolation walls 650 and 660 is a field oxide film FLX.

The side surfaces of the trench isolation wall 660 are covered with the P type well region 323 reaching the buried oxide film 101, and the side surfaces of the trench isolation wall 650 are covered with the P type well region 322 or 323 reaching the buried oxide film 101. This is aimed at covering a crystal defect occurred in the vicinity of the trench, in order to avoid that a leak current due to the crystal defect flows in the device.

C-2. Operation

Operation of the P channel DAD 3000 will be described by referring to FIGS. 18 and 19.

In on-operation of the P channel DAD 3000, when a gate signal is supplied to the first gate electrode 10B, in the P channel MOS transistor PT, holes are injected from the P type diffusion region 52 to the P type drain region 7 through a P type channel formed in the surface of the N type well region 4 and SOI layer 102 which are located immediately below the first gate electrode 10B. Then, the holes flow into the second drain electrode 13B and pass through the second drain wiring D2 to the source electrode 92B.

When the potential difference in the resistances R1 and R2 occurred due to hole current becomes a predetermined value, the second gate electrode 11B functions as a gate. Through an N channel formed in the surface of the P type well region 322 immediately underlying the second gate electrode 11B, electrons are injected from the N type diffusion region 62 to the SOI layer 102, and the injected electrons reach the first drain electrode 12B via the N type well region 611, thereby to control the potential of the first drain electrode 12B electrically connected to a low side (low potential) region which is not shown.

Thus, since the P channel MOS transistor PT is electrically isolated from the N channel MOS region NR, no holes flow straight down into the N channel MOS region NR, and no electrons flow straight down into the P channel MOS region PR. Therefore, an occurrence of modulation can be suppressed even if holes and electrons are obtained at a high density.

Since a parasitic thyristor structure is present in neither the P channel MOS transistor PT nor the N channel MOS region NR, as shown in FIG. 19, an occurrence of latch-up can be prevented principally to allow for an improvement in resistance to latch-up.

In addition, since the P channel MOS transistor PT is formed in the high side region HR, it is unnecessary to provide a trench isolation wall for electrically isolating the P channel MOS transistor PT from the N channel MOS region NR, thereby increasing the integration degree of a semiconductor device.

D. Fourth Preferred Embodiment

D-1. Device Configuration

As a fourth preferred embodiment of the present invention, a configuration of a P channel DAD 4000 will be described by referring to FIGS. 20 and 21.

D-1-1. Plan Configuration

Figure 20:
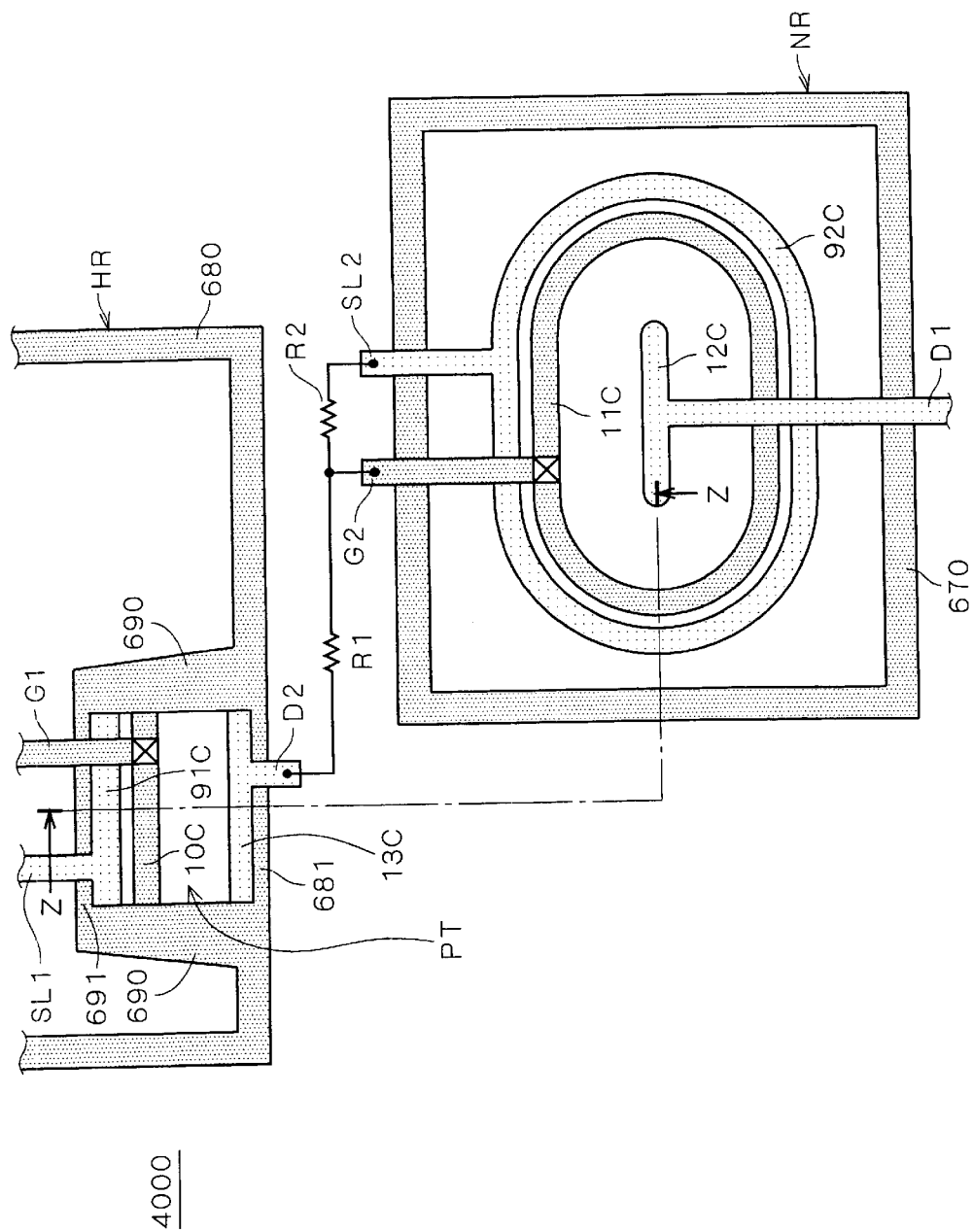
FIG. 20 is a diagram illustrating a plan configuration of a semiconductor device according to a fourth preferred embodiment.

FIG. 20 is a diagram illustrating a plan configuration of the P channel DAD 4000. As shown in FIG. 20, in the P channel DAD 4000, an N channel MOS region NR is surrounded and isolated by a trench isolation wall 670 (a second trench isolation wall), and a P channel MOS transistor PT is formed in a high side region HR and is surrounded and isolated by a trench isolation wall 690 (a side surface isolation wall), a trench isolation wall 691 (a first isolation wall) and trench isolation wall 681 (a second isolation wall), all of which are integral with a trench isolation wall 680 (a first trench isolation wall). The trench isolation walls 670, 680, 690, 691 and 681 can be called "isolation structure" because they isolate electrically the P channel MOS transistor PT from the N channel MOS region NR.

The P channel MOS transistor PT is made up of a linear source electrode 91C, first gate electrode 10C and second drain electrode 13C, which are provided in a parallel arrangement, in the order named, from the inside of the high side region HR.

The trench isolation wall 690 is disposed on both end portions of each of the source electrode 91C, first gate electrode 10C and second drain electrode 13C. The trench isolation wall 691 is located toward the inner side of the high side region HR than the source electrode 91C, and the trench isolation wall 681 is located toward the outer side than the second drain electrode 13C.

A source wiring SL1, first gate wiring G1 and second drain wiring D2 are connected to the source electrode 91C, first gate electrode 10C and second drain electrode 13C, respectively.

The source wiring SL1 and first gate wiring G1 are for example composed of a second layer aluminum wiring. The first gate wiring G1 overlaps the upper surface of the source electrode 91C and extends into the high side region HR. The source wiring SL1 overlaps the upper surface of the trench isolation wall 691 and extends into the high side region HR.

The second drain wiring D2 is for example composed of a first layer aluminum wiring and it overlaps the upper surface of the trench isolation wall 680 and extends to the outside of the high side region HR on the N channel MOS region NR side.

An N channel MOS transistor is formed by arranging so that in the N channel MOS region NR, a linear first drain electrode 12C is disposed at its midportion, a second gate electrode 11C of an elongated annulus ring is disposed so as to surround the first drain electrode 12C, and a source electrode 92C of an elongated annulus ring is disposed so as to surround the second gate electrode 11C.

A first drain wiring D1, second gate wiring G2 and source wiring SL2 are connected to the first drain electrode 12C, second gate electrode 11C and source electrode 92C, respectively.

The source wiring SL2 and second gate wiring G2 are for example composed of the second layer aluminum wiring. The source wiring SL2 overlaps the upper surface of the trench isolation wall 670. The second gate wiring G2 overlaps the upper surface of the source electrode 92C and trench isolation wall 670 and extends to the outside of the N channel MOS region NR on the high side region HR side.

The first drain wiring D1 is for example composed of the first layer aluminum wiring and it overlaps the upper surface of the second gate electrode 11C, source electrode 92C and trench isolation wall 670, and extends to the outside of the N channel MOS region NR which is opposite the high side region HR.

The first and second gate electrodes 10C and 11C are composed of a doped polysilicon and are connected via a contact hole to the first and second gate wirings G1 and G2, respectively.

The second drain wiring D2 is electrically connected via a resistance R1 to the second gate wiring G2, and the second gate wiring G2 is electrically connected via a resistance R2 to the source wiring SL2.

Although in the foregoing description the N channel MOS transistor has a coaxial shape of an elongated annulus ring, without limiting to this shape, it may have a coaxial shape of an annulus ring or rectangular ring.

D-1-2. Sectional Configuration of Major Parts

Figure 21:
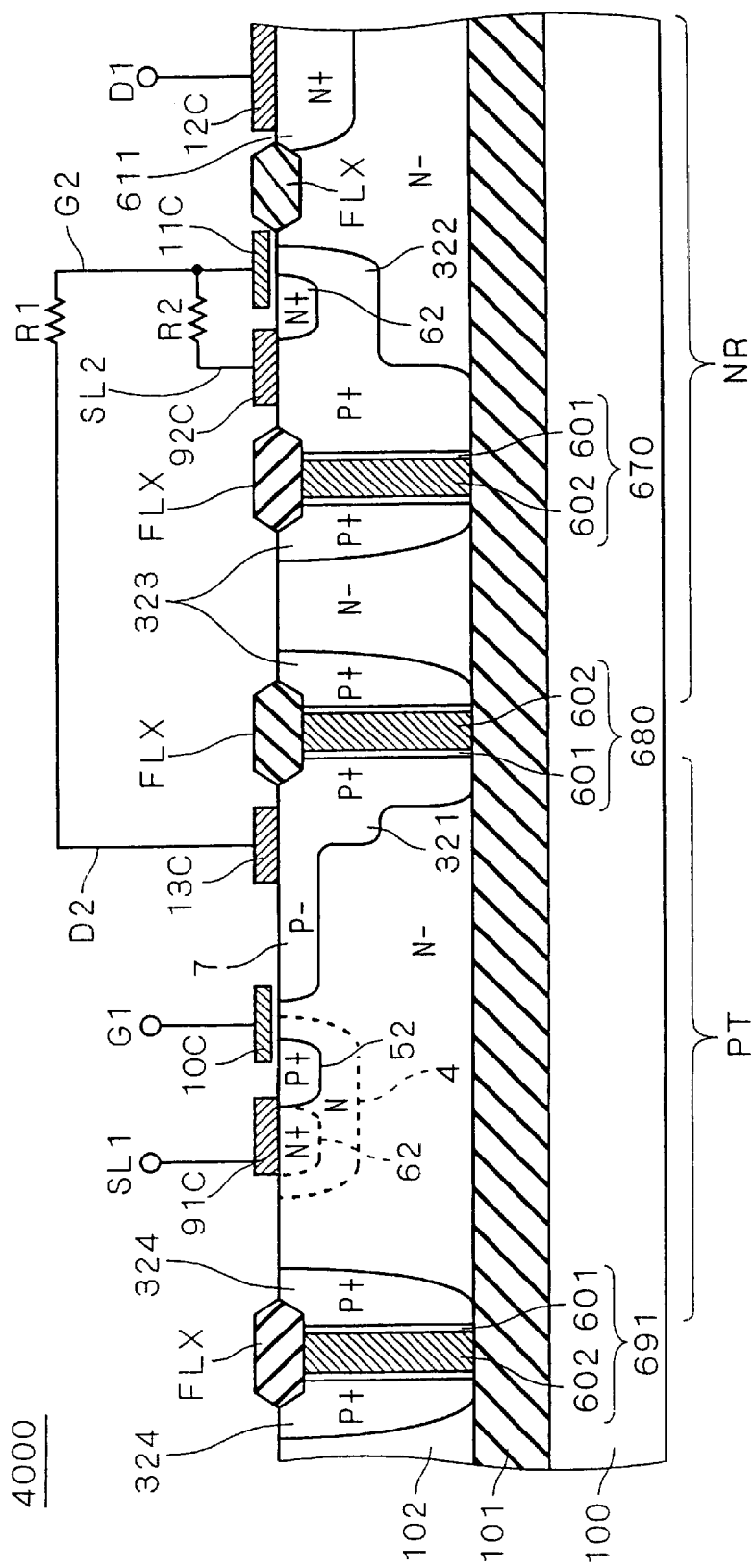
FIG. 21 is a diagram illustrating a sectional configuration of the semiconductor device of the fourth preferred embodiment.

FIG. 21 illustrates a sectional configuration taken along the line Z—Z in FIG. 20. As shown in FIG. 21, the P channel DAD 4000 is formed on a SOI substrate in which a buried oxide film 101 and SOI layer 102 ($N^-$) are disposed on a support substrate 100 such as a silicon substrate.

In a P channel MOS transistor PT, looking from the lefthand of FIG. 21, an N type well region 4 and a P type well region 321 ($P^+$) are disposed in the surface of the SOI layer 102 so that these regions are isolated from each other.

Between the P type well region 321 and N type well region 4, a P type drain region 7 ($P^-$) is formed so as to be continuous with the P type well region 321. The P type drain region 7 is formed at a shallower position than the P type well region 321.

Looking from the lefthand of FIG. 21, an N type diffusion region 62 ($N^+$) and a P type diffusion region 52 ($P^+$) are disposed adjacent each other in the surface of the N type well region 4. Since the N type well region 4 and N type diffusion region 62 ($N^+$) are not necessarily required, these are indicated by broken lines.

Disposed on a first main surface of the SOI layer 102 are a source electrode 91C, second drain electrode 13C and first gate electrode 10C. The source electrode 91C is formed in contact with the upper surface of the P type diffusion region 52 and the N type diffusion region 62 in order to cause a short-circuit therebetween. The second drain electrode 13C is formed in contact with the upper surface of the P type well region 321. The first gate electrode 10C is disposed as an insulating gate electrode, so as to cover the area from the upper surface of the peripheral portion of the P type drain region 7, the upper surface of the SOI layer 102 (between the P type drain region 7 and N type well region 4), the upper surface of the N type well region 4, and to the upper surface of the peripheral portion of the P type diffusion region 52.

In an N channel MOS region NR, looking from the righthand of FIG. 21, an N type well region 611 ($N^+$) and a P type well region 322 ($P^+$) are disposed in the surface of the SOI layer 102 so that these regions are isolated from each other.

An N type diffusion region 62 ($N^+$) is disposed in the surface of the P type well region 322.

Disposed on a first main surface of the SOI layer 102 are a source electrode 92C, first drain electrode 12C and second gate electrode 11C. The source electrode 92C is formed in contact with the upper surface of the N type diffusion region 62 and P type well region 322 in order to cause a short-circuit therebetween. The first drain electrode 12C is formed in contact with the upper surface of the N type well region 611. The second gate electrode 11C is disposed as an insulating gate electrode, so as to cover the area from the upper surface of the peripheral portion of the N type diffusion region 62, the upper surface of the P type well region 322, and to the upper surface of the SOI layer 102.

A field oxide film is disposed on the surface of the SOI layer 102 between the P type well region 322 and N type well region 611. The field oxide film is also disposed on the surface of the P type drain region 7 and P type well region 322, and multi-field plates are disposed thereon. Both of the field oxide film and the multi-field plates are not shown.

The trench isolation walls 691, 680 and 670 are constructed so that the inner wall of the trench extending through the SOI layer 102 to the buried oxide film 101 is covered with an inner wall oxide film 601, and a conductor 602 such as a doped polysilicon is buried in a region surrounded by the inner wall oxide film 601. Disposed on the trench isolation walls 691, 680 and 670 is a field oxide film FLX.

Side surfaces of the trench isolation wall 691 are covered with the P well region 324 reaching the buried oxide film 101. Side surfaces of the trench isolation wall 680 are covered with the P well region 321 or 323 reaching the buried oxide film 101. Side surfaces of the trench isolation wall 670 are covered with the P well region 322 or 323 reaching the buried oxide film 101. This is aimed at covering a crystal defect occurred in the vicinity of the trench, in order to avoid that a leak current due to the crystal defect flows in the device.

D-1-3. Construction and Function of Trench Isolation Wall

The construction and function of the trench isolation wall 690 will be described by referring to FIGS. 22 to 26.

FIG. 22 is a plan view illustrating in detail the trench isolation wall 690 and a P channel MOS transistor PT in the proximity thereof.

As shown in FIG. 22, the trench isolation wall 690 has a multi-trench structure made up of a plurality of trenches 22 located parallel to each electrode of the P channel MOS transistor PT. It is of course that a SOI layer 102 is present between trenches 22.

Multi-field plates MFPZ are disposed on the SOI layer 102 between a first gate electrode 10C and a second drain electrode 13C in the P channel MOS transistor PT.

The plate width (line) and plate interval (space) along the direction of array of the multi-field plates MFPZ are arranged so as to match the trench width (line) and trench interval (space) of the multi-trench structure.

With this construction, the potential distribution between source and drain can be made uniform thereby to suppress the field concentration at the boundary between the trench isolation wall 690 and P channel MOS transistor PT.

This mechanism will be described by referring to FIGS. 23 to 25.

Figure 23:
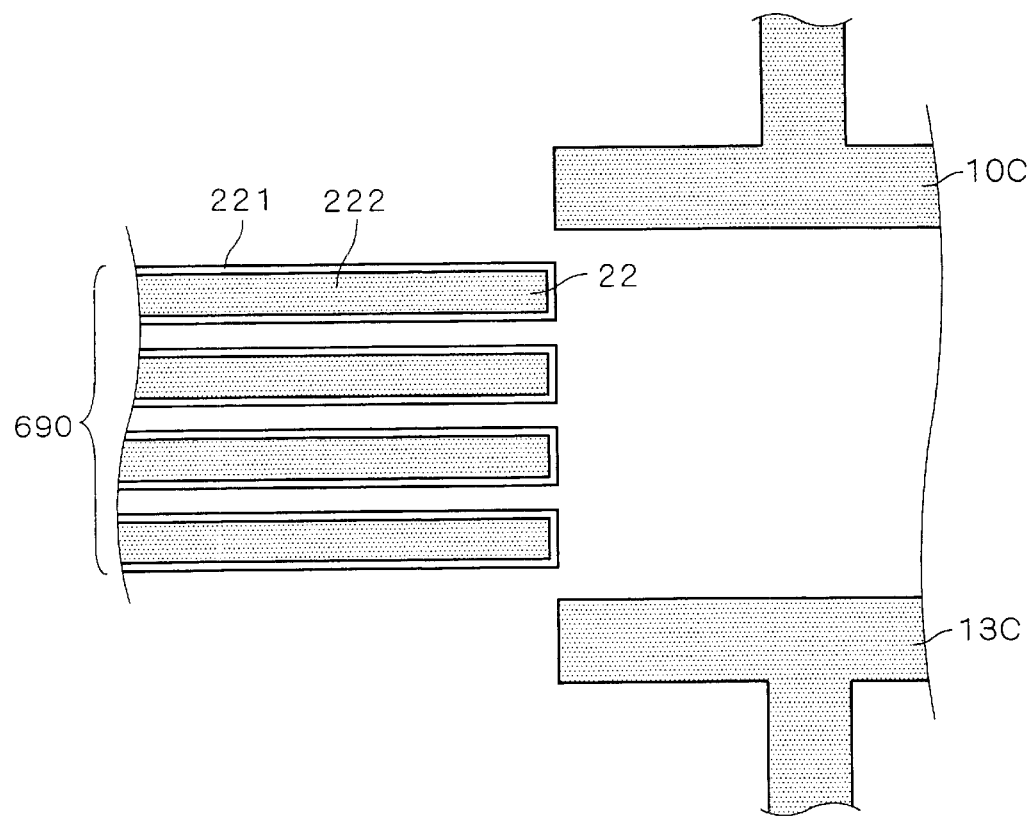

FIG. 23 is a diagram illustrating in detail the construction of the trenches 22, in which the trenches 22 are illustrated in an enlarged view and the multi-field plates MFPZ and the like are omitted in FIG. 22.

As shown in FIG. 23, each trench 22 is constructed so that its wall is covered with an inner wall oxide film 221 and a conductor 222 such as a doped polysilicon is buried in a region surrounded by the inner wall oxide film 221. The respective filled conductors are formed so as to make no electrical connection with any specific part.

FIG. 24 illustrates a field distribution occurred between source and drain when a forward blocking voltage is applied. The field occurred therebetween passes through the inner oxide film 221 of the trench 22 and is distributed at a region between a source electrode 91C and second drain electrode 13C of a P channel MOS transistor PT, and no field concentration occurs, resulting in approximately uniform distribution.

FIG. 25 illustrates a construction causing a field concentration. In the construction of FIG. 25, instead of the trench isolation wall 690 made up of a plurality of trenches 22, a single trench 23 is shown which has a trench width substantially corresponding to the distance between source and drain of the P channel MOS transistor PT.

In FIG. 25, only an inner wall oxide film 231 of the trench 23 is illustrated. A source voltage (positive potential) is supplied to one side of the source electrode 91C of the inner wall oxide film 231, and one side of the second drain electrode 13C is a ground potential.

In this construction, since the potential is the same in the conductor of the region surrounded by the inner oxide film 231, the field occurred between source and drain is concentrated at one side on the second drain electrode 13C of the inner wall oxide film 231. As a result, when the oxide film causes an insulating breakdown due to an excess of insulating breakdown voltage, and silicon has a field of which strength exceeds a critical field strength (V/cm) being the physical property value of silicon, there occurs the phenomenon that an avalanche current is induced and the space charge in a depletion layer is compensated to eliminate blocking characteristic (i.e., the property whereby no current flows upon application of voltage), thus failing to obtain a predetermined breakdown voltage characteristic.

However, the trench isolation wall 690 having the multi-trench structure can prevent a field concentration as described, thereby to cause no deterioration in breakdown voltage characteristic.

In addition, since the line and space of the multi-field plates MFPZ match the line and space of the multi-trench structure, it is able to adjust the field distribution of the region between the source electrode 91C and second drain electrode 13C of the P channel MOS transistor PT.

D-2. Operation

Operation of the P channel DAD 4000 is identical with that of the P channel DAD 3000 described by using FIGS. 18 and 19. The P channel MOS transistor PT is electrically isolated from the N channel MOS region NR. No holes flow straight down into the N channel MOS region NR, and no electrons flow straight down into the P channel MOS region PR. Therefore, an occurrence of modulation can be suppressed even if holes and electrons are obtained at a high density.

Since a parasitic thyristor structure is present in neither the P channel MOS transistor PT nor the N channel MOS region NR, as shown in FIG. 21, an occurrence of latch-up can be prevented principally to allow for an improvement in resistance to latch-up.

In addition, since the P channel MOS transistor PT is formed in the high side region HR, it is unnecessary to provide a trench isolation wall for electrically isolating the P channel MOS transistor PT from the N channel MOS region NR, thereby increasing the integration degree of a semiconductor device.

In the P channel DAD 4000, the P channel MOS transistor PT is closely surrounded by the trench isolation walls 690, 691 and 681 so as to be buried in these trench isolation walls. Therefore, the area occupied by the P channel MOS transistor PT is reduced to increase the integration degree of a semiconductor device.

D-3. Modification

The trench isolation wall 690 described by referring to FIG. 22 has the construction that a plurality of trenches 22 are located parallel to each electrode of the P channel MOS transistor PT. In this construction, the SOI layer 102 is present between trenches 22 and it is continuous with the SOI layer 102 between source and drain of the P channel MOS transistor PT.

With this construction, however, during on-operation of the P channel DAD 4000, hole carriers flowing between the source and drain of the MOS transistor PT are diffused and stored in the SOI layer 102 between trenches 22, which might cause an increase in switching loss.

Figure 26:
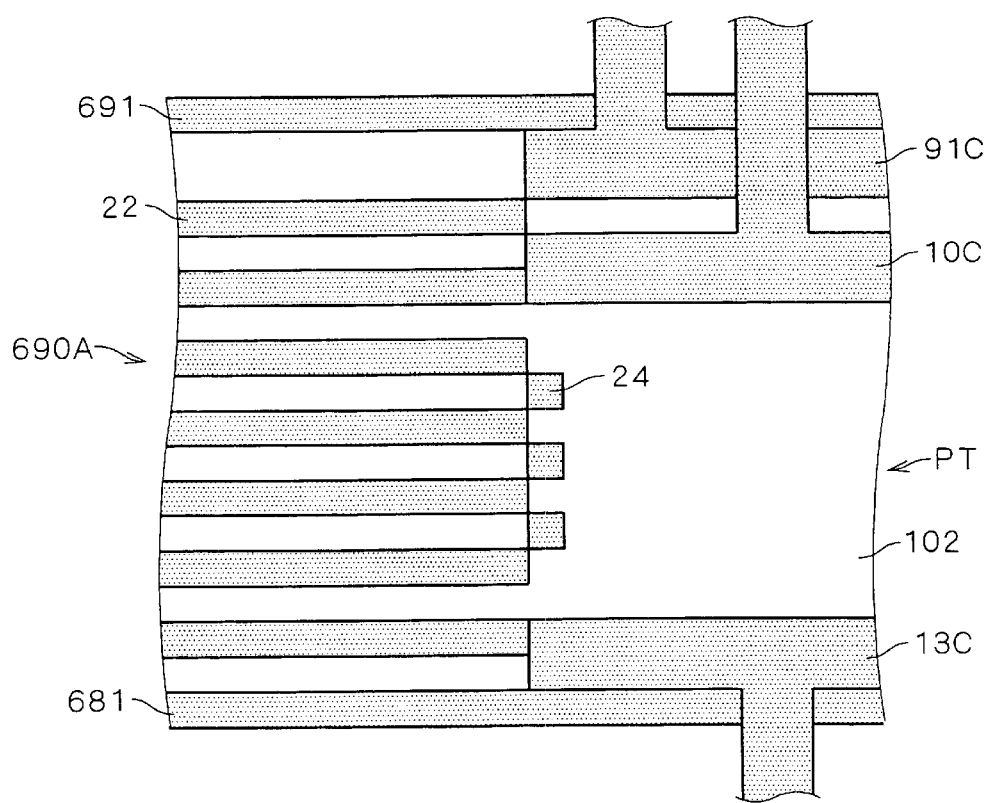
FIGS. 26 an 27 are diagrams illustrating part of a plan configuration of a modification of the semiconductor device in the fourth preferred embodiment.

This can be prevented by a trench isolation wall 690A having a construction shown in FIG. 26. FIG. 26 corresponds to FIG. 22, and the same reference numerals are used for similar parts and a description thereof is thus omitted. For the sake of convenience, multi-field plates MFPZ are omitted.

Referring to FIG. 26, a trench 24 is disposed on the end portion on a P channel MOS transistor PT side in a SOI layer 102 between trenches 22, so as to make a contact with the trench 22 on both sides.

Figure 27:
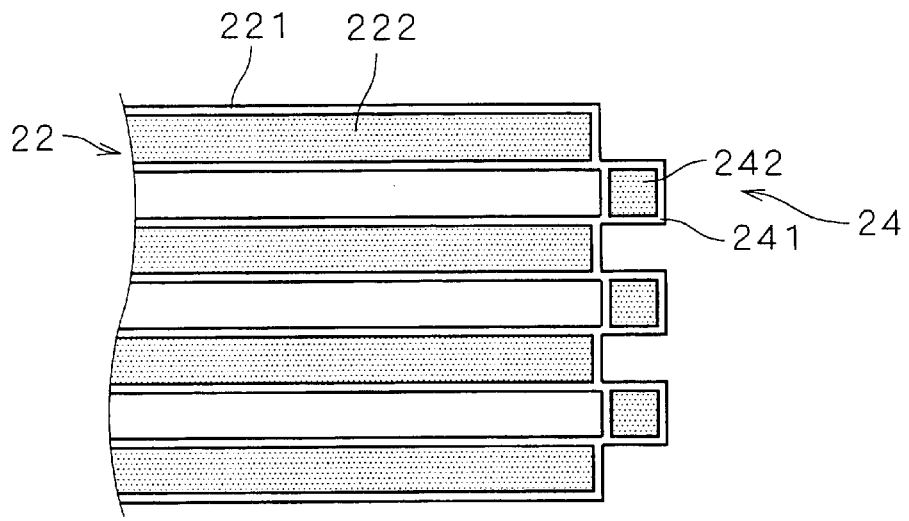

FIG. 27 illustrates partially the details of the construction of the trench isolation wall 690A. As shown in FIG. 27, a first side of the trench 24 is approximately the same as the distance between trenches 22, and a second side orthogonal to the first side has approximately the same length as the first side. The trench 24 is rectangle in plan configuration.

The trench 24 is identical with the trench 22 in terms of structure, and is constructed so that its wall is covered with an inner wall oxide film 241 and a conductor 242 such as a doped polysilicon is buried in a region covered with the inner wall oxide film 241.

The trench 24 is disposed so as to be in contact and integral with an inner wall oxide film 221 of the trenches 22 on both sides. This construction aims to prevent that hole carriers flow from the P channel MOS transistor PT down into the SOI layer 102 between trenches 22.

The SOI layer 102 of the P channel MOS transistor PT opposed to the trench isolation wall 690A is precisely the P type drain region 7 (drift region) shown in FIG. 21, to which hole carriers move.

By the presence of the trench 24, it is avoided that hole carriers are stored in the SOI layer 102 between trenches 22. This prevents an increase in switching loss.

Like the trench isolation wall 690, the trench isolation wall 690A can also prevent a field concentration thereby to obtain a stable breakdown voltage characteristic.

A method of manufacturing a trench isolation wall 690A will be described by referring to FIGS. 28 and 29.

Figure 28:
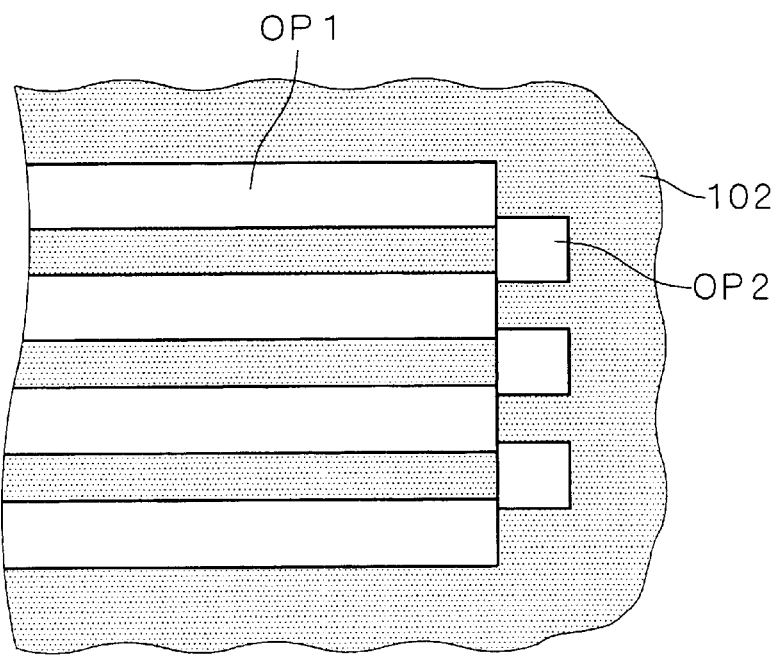
Figure 30:
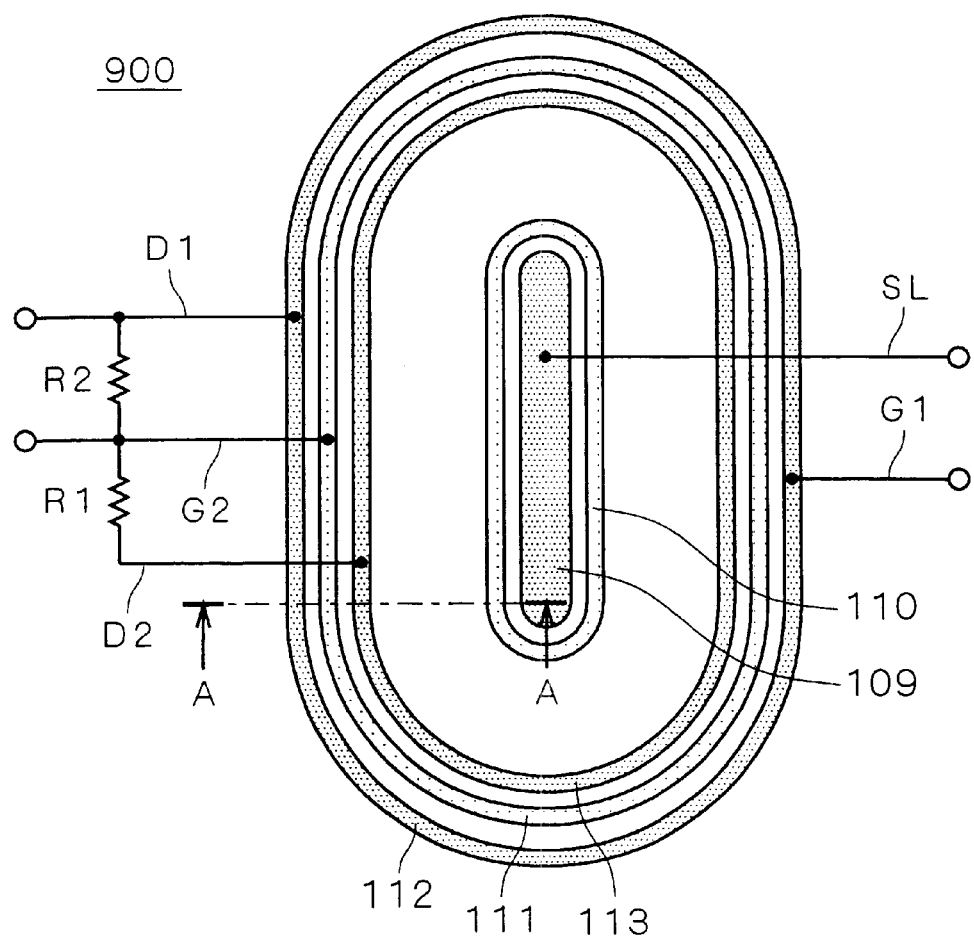
FIG. 30 is a diagram illustrating a plan configuration of a conventional DAD.
Figure 31:
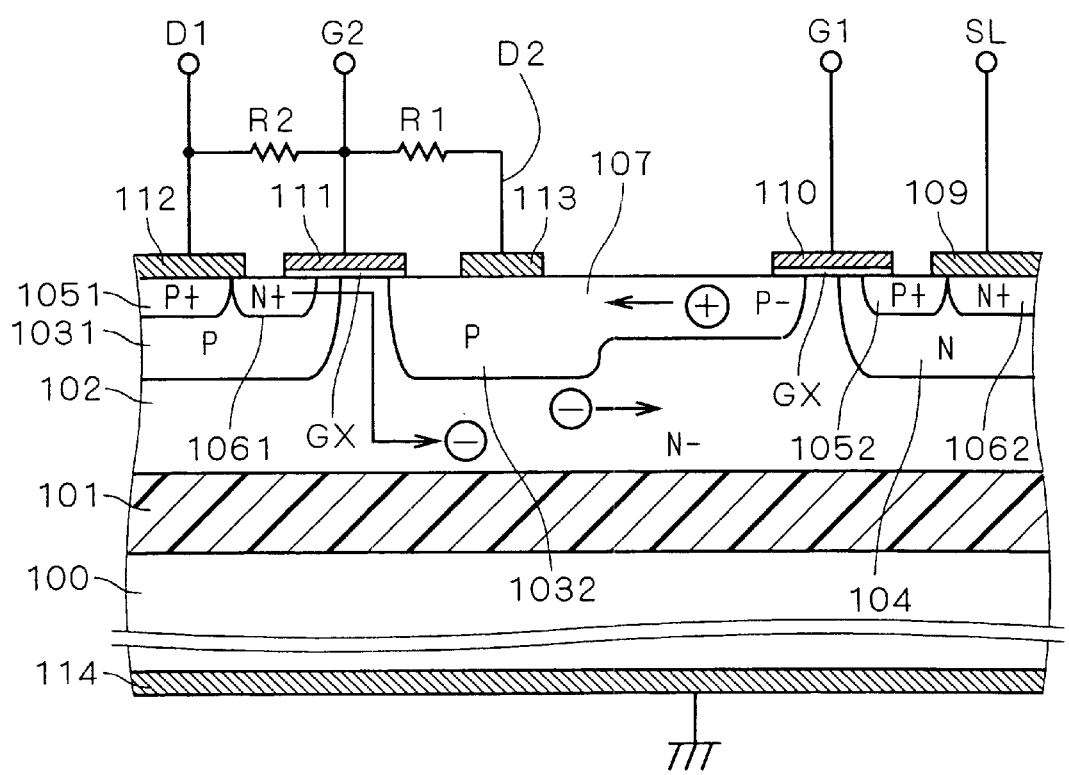
FIG. 31 is a diagram illustrating a sectional configuration of the conventional DAD.
Figure 32:
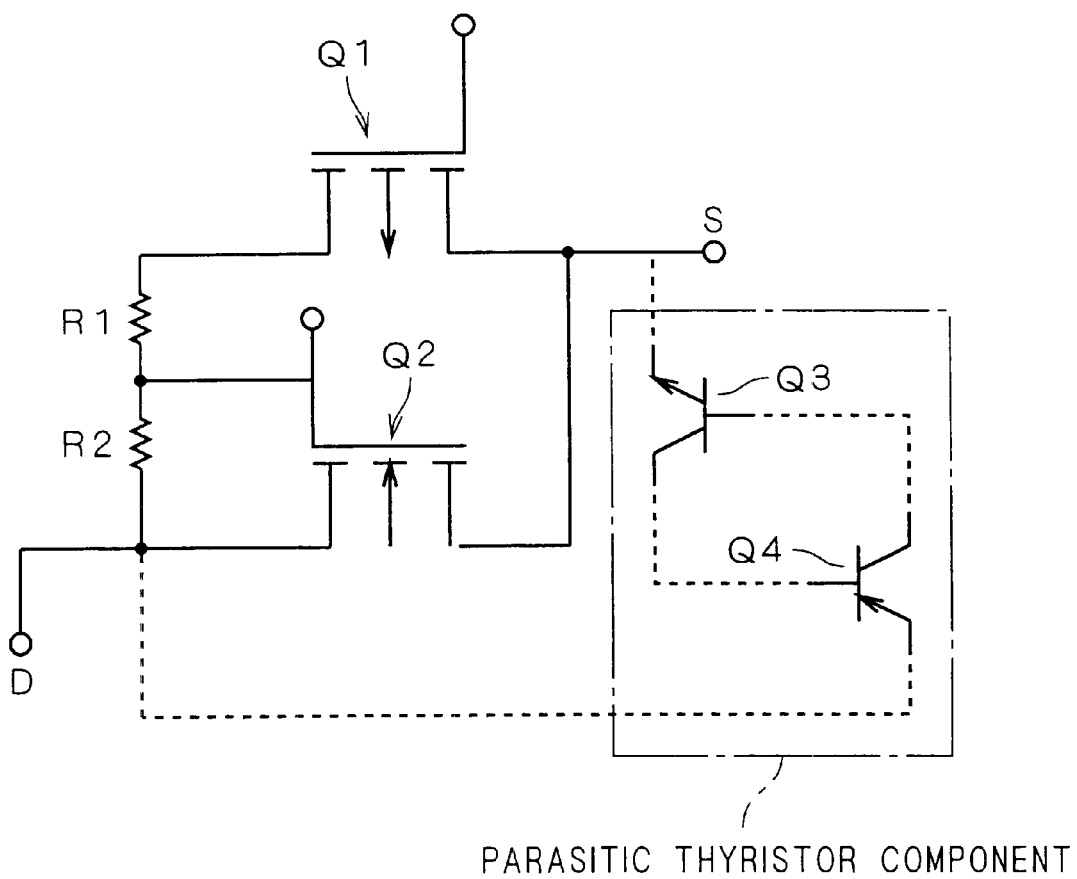
FIG. 32 is a diagram illustrating an equivalent circuit of the conventional DAD.

As shown in FIG. 28, openings OP1 and OP2 that correspond to trenches 22 and 24, respectively, are formed in a first main surface of a SOI layer 102. The interval between openings OP1 is about 2 μm to 3 μm.

Next, the inner surface of the openings OP1 and OP2 is oxidized to form inner wall oxide films 221 and 241 having a thickness of 0.1 μm to 0.2 μm (1000 to 2000 Angstrom). At this time, the inner wall oxide films 221 and 241 are integral with each other.

Subsequently, conductors 222 and 242 such as a doped polysilicon are buried in a region surrounded by the inner wall oxide films 221 and 241, resulting in the trench isolation wall 690A.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising first and second MOS transistors having different conductive types of which main current flows in a lateral direction and being disposed on a SOI substrate constructed by having on a support substrate a buried oxide film and a SOI layer, wherein the potential of a control electrode of said second MOS transistor is controlled according to a potential based on the main current of said first MOS transistor, to control on-off operation of said second MOS transistor, said semiconductor device further comprising in said SOI layer an isolation structure for electrically isolating said first and second MOS transistors in order to cut off a passage through which the main current of said first MOS transistor passes a region for forming said second MOS transistor and flows into a first main electrode of said second MOS transistor.

2. The semiconductor device according to claim 1 wherein
   (i) said first MOS transistor comprises:
      a first main electrode having a linear shape in plan configuration;
      a linear shape control electrode having a length not exceeding the length of said first main electrode and being disposed parallel to said first main electrode; and
      a linear shape second main electrode having the same length as said control electrode and being disposed parallel to said control electrode,
   (ii) said first main electrode of said second MOS transistor has a plan configuration of an elongated annulus ring surrounding, as its midportion, said first main electrode of said first MOS transistor and enclosing said first MOS transistor, said second MOS transistor comprising:
      a control electrode disposed along the inside of said elongated annulus ring; and
      a second main electrode provided in common to said first main electrode of said first MOS transistor,
   (iii) said isolation structure comprises:
      isolation regions disposed on both ends of said control electrode and both ends of said second main electrode of said first MOS transistor, so as to extend between one ends and between the other ends of said control electrode and said second main electrode of said first MOS transistor,
   (iv) said isolation regions comprise:
      plural trenches of which contour is defined by an impurity region for PN junction isolation, and which are disposed in said impurity region and reach said buried oxide film constituting said SOI substrate, and
   (v) said plural trenches are arranged in at least one line from said first main electrode to said second main electrode of said first MOS transistor,
   each of said plural trenches having:
      an inner wall oxide film covering the inner wall; and
      a conductor buried in a region surrounded by said inner wall oxide film.

3. The semiconductor device according to claim 2 wherein
   said second main electrode of said first MOS transistor is connected via a first resistance component to said control electrode of said second MOS transistor, and
   said control electrode of said second MOS transistor is connected via a second resistance component to said first main electrode of said second MOS transistor.

4. The semiconductor device according to claim 2 further comprising:
   plural multi-field plates disposed coaxially around said first main electrode of said first MOS transistor on an upper portion of said SOI layer that is provided inside said first main electrode of said second MOS transistor,
   wherein a trench width and a trench interval along the direction of array of said plural trenches are set so as to substantially match a plate width and a plate interval along the direction of array of said multi-field plates.

5. The semiconductor device according to claim 1 wherein
   (i) said first MOS transistor comprises:
      a first main electrode being at the center of a coaxial structure;
      a control electrode surrounding said first main electrode; and
      a second main electrode surrounding said control electrode,
   (ii) said second MOS transistor comprises:
      said first main electrode being at the outermost periphery of coaxial structure;
      a second main electrode being at the center of coaxial structure; and
      a control electrode disposed along the inside of said first main electrode,
   (iii) said isolation structure comprises:
      a first trench isolation wall reaching said buried oxide film and being disposed in said SOI layer so as to surround said first MOS transistor; and
      a second trench isolation wall reaching said buried oxide film and being disposed in said SOI layer so as to surround said second MOS transistor,
   each of said first and second trench isolation walls having:
      an inner wall oxide film covering the inner wall; and
      a conductor buried in a region surrounded by said inner wall oxide film.

6. The semiconductor device according to claim 5 wherein
   said second main electrode of said first MOS transistor is connected via a first resistance component to said control electrode of said second MOS transistor, and said control electrode of said second MOS transistor is connected via a second resistance component to said first main electrode of said second MOS transistor.

7. The semiconductor device according to claim 1 wherein
(i) said first MOS transistor comprises:
a first main electrode being at the outermost periphery of a coaxial structure;
a control electrode disposed along the inside of said first main electrode; and
a second main electrode being at the center of said coaxial structure,
(ii) said second MOS transistor comprises:
a first main electrode being at the outermost periphery of coaxial structure;
a second main electrode being at the center of coaxial structure; and
a control electrode disposed along the inside of said first main electrode,
(iii) said isolation structure comprises:
first and second trench isolation walls reaching said buried oxide film and being disposed in said SOI layer so as to surround a high side region of a relatively high potential and said second MOS transistor,
each of said first and second trench isolation walls having:
an inner wall oxide film covering the inner wall; and
a conductor buried in a region surrounded by said inner wall oxide film, and
said first MOS transistor being disposed in said high side region.

8. The semiconductor device according to claim 7 wherein
said second main electrode of said first MOS transistor is connected via a first resistance component to said control electrode of said second MOS transistor, and
said control electrode of said second MOS transistor is connected via a second resistance component to said first main electrode of said second MOS transistor.

9. The semiconductor device according to claim 1 wherein
(i) said first MOS transistor comprises:
a first main electrode having a linear shape in plan configuration;
a linear shape control electrode disposed parallel to said first main electrode and having a length not exceeding the length of said first main electrode; and
a linear shape second main electrode disposed parallel to said control electrode and having the same length as said control electrode,
(ii) said second MOS transistor comprises:
said first main electrode being at the outermost periphery of a coaxial structure;
a second main electrode being at the center of said coaxial structure; and
a control electrode disposed along the inside of said first main electrode,
(iii) said isolation structure comprises:
first and second trench isolation walls reaching said buried oxide film and being disposed in said SOI layer so as to surround a high side region of a relatively high potential and said second MOS transistor,
said first MOS transistor being disposed in said high side region, each of said first and second trench isolation walls having:
an inner wall oxide film covering the inner wall; and
a conductor buried in a region surrounded by said inner wall oxide film,
said first trench isolation wall having:
side surface isolation walls disposed on both end portions of said first main electrode, said control electrode and said second main electrode of said first MOS transistor, so as to extend between one end portions and between the other end portions of said first main electrode, said control electrode and said second main electrode of said first MOS transistor; and
first and second isolation walls disposed outside of said first and second main electrodes of said first MOS transistor, and
said first MOS transistor being surrounded by said side surface isolation walls and said first and second isolation walls.

10. The semiconductor device according to claim 9 wherein
said second main electrode of said first MOS transistor is connected via a first resistance component to said control electrode of said second MOS transistor, and
said control electrode of said second MOS transistor is connected via a second resistance component to said first main electrode of said second MOS transistor.

11. The semiconductor device according to claim 9 wherein
said side surface isolation walls have:
plural trenches disposed at a predetermined interval so as to be parallel to each electrode of said first MOS transistor,
each of said trenches having:
said inner wall oxide film; and
said conductor buried in a region surrounded by said inner wall oxide film, and each one end of said plural trenches being arranged along the peripheral portion of said region for forming said first MOS transistor.

12. The semiconductor device according to claim 9 wherein
said side surface isolation walls have:
plural first trenches arranged at predetermined interval so as to be parallel to each electrode of said first MOS transistor; and
plural second trenches of a rectangle shape in plan configuration disposed at the peripheral portion of the array of said plural first trenches,
each of said plural first and second trenches having:
said inner wall oxide film; and
said conductor buried in said region surrounded by said inner wall oxide film,
each one end of said plural first trenches being arranged along the peripheral portion of said region for forming said first MOS transistor,
said plural second trenches being disposed so as to block the end portion of said SOI layer among said plural first trenches,
said inner wall oxide film of said plural first trenches and said inner wall oxide film of said plural second trenches being joined and integral with each other.

* * * * *